United States Patent [19]
Green et al.

[11] Patent Number: 5,835,401
[45] Date of Patent: Nov. 10, 1998

[54] DRAM WITH HIDDEN REFRESH

[75] Inventors: Gary W. Green, Pleasanton, Calif.;
John Q. Torode, Hunts Point, Wash.;
T. J. Rodgers, Woodside; Shailesh Shah, San Jose, both of Calif.

[73] Assignee: Cypress Semiconductor Corporation, San Jose, Calif.

[21] Appl. No.: 760,823

[22] Filed: Dec. 5, 1996

[51] Int. Cl.⁶ .................................. G11C 11/24
[52] U.S. Cl. ........................... 365/149; 365/222
[58] Field of Search .................. 365/149–222, 365/230.06, 233

[56] References Cited

U.S. PATENT DOCUMENTS

| | | | |
|---|---|---|---|
| 3,795,898 | 3/1974 | Mehta et al. | 340/173 |
| 3,964,030 | 6/1976 | Koo | 340/173 |
| 4,763,178 | 8/1988 | Sakui et al. | 357/23.6 |
| 4,791,606 | 12/1988 | Threewitt et al. | 365/49 |
| 4,831,585 | 5/1989 | Wade et al. | 365/49 |
| 4,969,148 | 11/1990 | Nadeau-Dostie et al. | 371/21.1 |
| 5,144,584 | 9/1992 | Hoshino | 365/222 |
| 5,315,557 | 5/1994 | Kim et al. | 365/222 |
| 5,335,202 | 8/1994 | Manning | 365/222 |
| 5,349,587 | 9/1994 | Nadeau-Dostie et al. | 371/22.3 |
| 5,373,475 | 12/1994 | Nagase | 365/222 |
| 5,453,959 | 9/1995 | Sakuta et al. | 365/222 |
| 5,596,545 | 1/1997 | Lin | 365/236 |

FOREIGN PATENT DOCUMENTS

| | | | |
|---|---|---|---|
| 0 102 178A2 | 7/1984 | European Pat. Off. | H01L 27/10 |
| 0 107 340 B1 | 7/1992 | European Pat. Off. | G11C 11/24 |

OTHER PUBLICATIONS

"BICMOSG³ Cell—A Novel High–Speed DRAM Cell Taking Advantage of BICMOS Technology"; R. Richter, et al; Institute for Physics of Semiconductors Academy of Sciences of rthe GDR; Walter–Korsing–Str. 2, 1200 Frankfurt (Oder), GDR. pp. 457–460.

"A 200 MHz 0.8 µm BiCOMOS Modular Memory Family of DRAM and Multiport SRAM"; by: Allan L. Silburt, et al.; IEEE 1992 Custom Integrated Circuits Conference, 1992. pp. 7.2.1–7.2.4.

"A 180 MHz 0.8 µm BiCOMOS Modular Memory Family of DRAM and Multiport SRAM"; by Allan L. Silburt, et al.; IEEE Journal of Solid State Circuits, vol. 28, No. 3, Mar., 1993. pp. 222–232.

"A 553K–Transistor LISP Processor Chip" by: Patrick W. Bosshart, et al; IEEE Journal of Solid–State Circuits, vol. SC–22, No. 5, Oct. 1987, pp. 808–819.

"Using Cache Mechanisms to Exploit Nonrefreshing DRAM's for On–Chip Memories" by David D. Lee and Randy H. Katz; IEEE Journal of Solid–State Circuits, vol. 26, No. 4, Apr. 1991. pp. 657–661.

"32K × 32 Fusion Memory™ Synchronous Pipelined Cache RAM"; Integrated Device Technology, Inc.; May, 1996; pp. 9.3.1–9.3.5.

Delgado–Frias et al., "A VLSI Interconnection Network Router Using a D–CAM with Hidden Refresh", 1996, pp. 246–251.

Hanamura et al., "A 256K CMOS SRAM with Internal Refresh", IEEE International Solid–State Circuits Conference, ISSCC 87, Feb. 27, 1987, pp. 250–251 & 414.

*Primary Examiner*—A. Zarabian
*Attorney, Agent, or Firm*—Blakely, Sokoloff, Taylor & Zafman LLP

[57] ABSTRACT

A method and circuit for hiding a refresh of DRAM cells in a memory device. One embodiment of the circuit includes a selection circuit configured to select a first row of DRAM cells in the memory circuit in response to an active control signal. As a result, data may be read from or written to at least one of the DRAM cells in the first row. The selection circuit is also configured to couple a refresh address to a second row of DRAM cells in the memory circuit in response to an inactive state control signal. The second row of cells is refreshed when the selection circuit accesses the second row. For one embodiment, the DRAM cells are four transistor DRAM cells.

15 Claims, 12 Drawing Sheets

DRAM WITH HIDDEN REFRESH

BACKGROUND OF THE INVENTION

1. Field of the Invention

The present invention relates to memory circuits. More particularly, the present invention relates to a dynamic random access memory (DRAM) and a method for refreshing DRAM cells.

2. Art Background

Conventional volatile memory devices typically use static random access memory (SRAM) cells or dynamic random access memory (DRAM) cells to store data.

An SRAM cell typically comprises six transistors as illustrated in SRAM cell 100 of FIG. 1 (resistors R1 and R2 are often formed from transistor elements) whose method of operation is well known. SRAM cell 100 has a number of advantageous features. First, it is a static circuit that holds data when the wordline is not selected, that is, when the wordline is driven to a low voltage level. Second, reading data stored in SRAM cell 100 is non-destructive, that is, the cell data is not lost when a read operation occurs. Third, the use of a differential sense amplifier coupled to bitlines BL and BL* makes reading the data stored in SRAM cell 100 very fast.

SRAM cell 100 also has a number of disadvantages relative to DRAM cells. First, SRAM cell 100 may consume a greater amount of area on an integrated circuit because of the greater number of circuit elements. Second, there is always some DC current flow through either resistor R1 and transistor 110, or through resistor R2 and transistor 112.

FIG. 2 shows a typical one-transistor DRAM cell 200 that stores data as charge on capacitor $C_S$. The operation of DRAM cell 200 is also well known.

DRAM cell 200 has the advantage of reducing the circuit elements in memory cell to one transistor and one capacitor. Therefore, more DRAM cells can be made per unit area of silicon than SRAM cells. Additionally, the only DC power dissipated by DRAM cell 200 is leakage current associated with capacitor $C_S$.

DRAM cells suffer a number of relative disadvantages. First, when DRAM cell 200 is not being accessed, the charge stored on capacitor $C_S$ leaks away over time. Therefore, DRAM cell 200 must be refreshed on a periodic basis. Refresh normally occurs by reading the data stored on capacitor $C_S$ and then writing the data back onto capacitor $C_S$. Refreshing requires system time and resources and degrades overall system performance. When refresh is occurring, normal reads and writes to the memory device are interrupted.

Second, reading data stored in DRAM cell 200 is destructive. Reading data from capacitor $C_S$ onto bitline BL results in loss of the data stored on capacitor $C_S$.

Third, because of the charge sharing mechanism for reading data from DRAM cell 200, reading tends to be significantly slower than with an SRAM device coupled to a differential sense amplifier.

Fourth, refreshing more than one DRAM cell 200 at one time requires a substantial amount of additional circuitry (e.g., at least one logic circuit per bitline or wordline), and can be quite complex, particularly in an array of greater than 256 cells, more particularly in an array of greater than or equal to 1 thousand (1K) cells.

FIG. 3 shows a four transistor DRAM cell 300 that is essentially a six-transistor SRAM cell (or four transistor SRAM cell with two resistor pull-ups) with the pull-up transistors/resistors removed (i.e., resistors R1 and R2 removed from SRAM cell 100 in FIG. 1). DRAM cell 300 is a DRAM cell because data capacitively stored on nodes 314 and 316 will leak away unless DRAM cell 300 is refreshed on a periodic basis.

Data is written to nodes 314 and 316 by raising the wordline to a high level, and providing data on bitlines BL and BL*. The data is written to nodes 314 and 316 via pass gates 306 and 308, respectively.

Data is read from DRAM cell 300 by raising the wordline to a high level and sensing the voltages generated on BL and BL*. The voltage generated on BL is caused by the voltage divider circuit formed by bitline load 302, pass gate 306, and pull-down transistor 310. The voltage generated on BL* is caused by the voltage divider circuit formed by bitline load 304, pass gate 308, and pull-down transistor 312. The voltages generated on BL and BL* may then be applied to a differential sense amplifier (not shown).

DRAM cell 300 enjoys at least one of the benefits of SRAM cells, including a non-destructive read operation. DRAM cell 300 may offer the same speed as SRAM cell 100. For cells comprising features of equal dimensions, DRAM cell 300 is larger than one transistor DRAM cell 200 and smaller than SRAM cell 100 of FIG. 1. DRAM cell 300 also enjoys at least one of the benefits of DRAM cells, including low DC power dissipation relative to SRAM cells. The DC power dissipation of DRAM cell 300 is limited only to the leakage currents associated with nodes 314 and 316, and the current consumed during a refresh function.

Like other DRAM cells, DRAM cell 300 must be periodically refreshed in order to function properly. DRAM cell 300 has an advantageous feature in that selecting and/or reading the cell refreshes the data stored in the cell. Thus, DRAM cell 300 may be considered as "self-refreshing" or "self-writing". For example, if a logic one is stored on node 314 and a logic zero is stored on node 316, then raising the wordline to a high level will allow bitline load 302 to charge node 314 via pass gate 306. Refreshed node 314 will reinforce the logic zero stored on node 316.

As previously described, refreshing a DRAM cell requires system time and resources, and reduces the overall performance of the system and memory device(s) within the system. For example, DRAM cell 300 must be periodically accessed and/or read before the capacitive charge stored on nodes 314 and 316 leaks to below a threshold value to maintain the correct and/or valid data on nodes 314 and 316. Additionally, the normal read and write of data to DRAM cell 300 will have to be interrupted in order to refresh DRAM cell 300.

Various RAM devices incorporating a four transistor DRAM cell are known. For example, U.S. Pat. No. 3,795,898 issued to Mehta et al. discloses a RAM device having a four-transistor DRAM cell that is continuously refreshed. Refreshing is accomplished, at the expense of increasing die size by including a pair of charge pump devices within the DRAM cell. Additionally, an AC voltage must be generated and applied to the charge pump devices.

U.S. Pat. No. 4,831,585 issued to Wade et al. discloses a four-transistor CAM cell that is refreshed by reading the contents of the CAM cell and then re-writing the contents into the CAM cell.

A four-transistor DRAM cache memory with selective invalidation is disclosed by D. Lee and R. Katz in USING CACHE MECHANISMS TO EXPLOIT NONREFRESHING DRAM'S FOR ON-CHIP MEMORIES published in IEEE JOURNAL OF SOLID-STATE CIRCUITS, Vol. 26, No. 4, pp. 657–661, April 1991. The selective invalidation scheme does not refresh DRAM cache entries; rather, invalidation circuitry and REFRESH bits are used to selectively invalidate DRAM cache entries that have not been refreshed during one half of an actual DRAM refreshing period. The selective invalidation scheme may be used in either an instruction-only or write-through cache wherein up-to-date copies of the cache entries reside offchip in an external cache or main memory.

Multiple four-transistor DRAM memories are disclosed by P. Bosshart et al. in A 533K-TRANSISTOR LISP PROCESSOR CHIP published in IEEE JOURNAL OF SOLID-STATE CIRCUITS, Vol. SC-22, No. 5, pp. 808–819, October 1982. The DRAM's are allowed to be refreshed by pseudo-random refresh counters only when the DRAM is not required for reading and a writeback buffer is empty. If all of the multiple DRAM memories have not yet been refreshed at the end of a refresh period, then instruction is interrupted and refresh cycles are issued to correct the problem.

A four-transistor DRAM is disclosed for use in modular memories by A. Silburt et al. in A 180-MHz 0.8-$\mu$m BiCMOS MODULAR MEMORY FAMILY OF DRAM AND MULTIPORT SRAM published in IEEE JOURNAL OF SOLID-STATE CIRCUITS, Vol. 28, So 3, pp. 222–232, March 1993, and also in A 200 MHz 0.8 $\mu$m BiCMOS MODULAR MEMORY FAMILY OF DRAM AND MULTIPORT SRAM from IEEE 1992 CUSTOM INTEGRATED CIRCUITS CONFERENCE. The four-transistor DRAM cells are disclosed as having advantages over one-transistor DRAM cells and may be refreshed by wordline access. No means is disclosed for refreshing the DRAM cells without interrupting execution of the modular memory device.

To date, no system has incorporated circuitry that can refresh DRAM cells in a system without interrupting the read and write execution of the memory device and/or adversely affecting performance (e.g., increasing access times, current dissipation, restricting accessibility, enlarging the DRAM cell, etc.). A refresh may be considered "hidden" from a system when it does not interrupt the read and write execution of the memory device and/or significantly adversely affect system performance. System performance of all known prior systems is adversely affected to some extent by known refreshing methods, or by waiting for a memory device to perform its own internal refresh.

Therefore, a strong need is felt for a memory device that can combine the increased cell densities and low power dissipation of DRAM cells with the performance and/or advantages of SRAM cells.

SUMMARY OF THE INVENTION

The present invention concerns a circuit for refreshing DRAM cells in a memory device. One embodiment of the circuit includes a selection circuit configured to select a first row of DRAM cells in the memory circuit in response to an active control signal. As a result, data may be read from or written to at least one of the DRAM cells in the first row. The selection circuit is also configured to couple a refresh address to a second row of DRAM cells in the memory circuit in response to an inactive state of the control signal. The second row of cells may be refreshed when the selection circuit accesses and/or reads the second row of cells. For one embodiment, the DRAM cells are four transistor DRAM cells.

The present invention also concerns a method of refreshing DRAM cells, comprising the steps of: selecting a first row of DRAM cells based on a read/write address and the first state of a control signal, wherein data may be read from or written to at least one of the cells in the first row; and selecting a second row of DRAM cells based on a refresh address and a second state of the control signal. The second row of DRAM cells may be refreshed by selecting and/or reading the cells in the second row. For one embodiment, the DRAM cells are four transistor DRAM cells.

The present invention may enable more memory cells to be placed in a memory device as compared with standard six-transistor and/or four-transistor/two-resistor SRAM cells. Given that the refresh of the DRAM arrays are completely hidden, a memory device incorporating the present invention may externally function like a normal SRAM device.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, in which.

DETAILED DESCRIPTION

A method and apparatus for hidden refresh of a dynamic random access memory (DRAM) cell is disclosed. In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Furthermore, signal names followed by the asterisk symbol "*" are active low signals.

As illustrated in the embodiments below, the present invention may utilize a four transistor DRAM cell in a circuit that may otherwise normally use an SRAM cell. The reduced size of the four transistor DRAM cell compared with a conventional four-transistor/two-resistor or six transistor SRAM cell enables more memory to be put on a single device.

The four transistor memory cell performs at optimal capabilities when periodically refreshed. In the present invention, the refresh operation is entirely hidden from the system, such that the system does not have to be interrupted to refresh the DRAM cells. Furthermore, since the refresh is hidden, the DRAM array appears to function like an SRAM array to the system.

The embodiments illustrated below operate with circuits that are both synchronous and asynchronous. The asynchronous circuits advantageously include a control signal that changes states at a sufficient frequency (e.g., a chip enable signal or a chip select signal) so that the DRAM cells are refreshed before they lose data. The synchronous circuits advantageously include a control signal that may comprise a clock signal or the combination of a clock signal and a chip enable signal or a chip select signal, which may enable the DRAM cells to be refreshed before they lose data.

The embodiments illustrated below may be incorporated into synchronous and asynchronous memory devices, including cache memory, cache controllers with onboard memory, FIFOs, SRAMs, and multi-port RAMs. Moreover, the circuitry enabling the present method of refreshing may be incorporated into a memory device, or alternatively, partially or wholly reside outside the memory device.

Furthermore, the present invention encompasses other types of DRAM cells that have properties similar to a four-transistor DRAM cell, including refreshing the DRAM cell by selecting and/or reading the DRAM cell, and simultaneously refreshing multiple DRAM cells by selecting and/or reading the DRAM memory cells.

Figure 1:
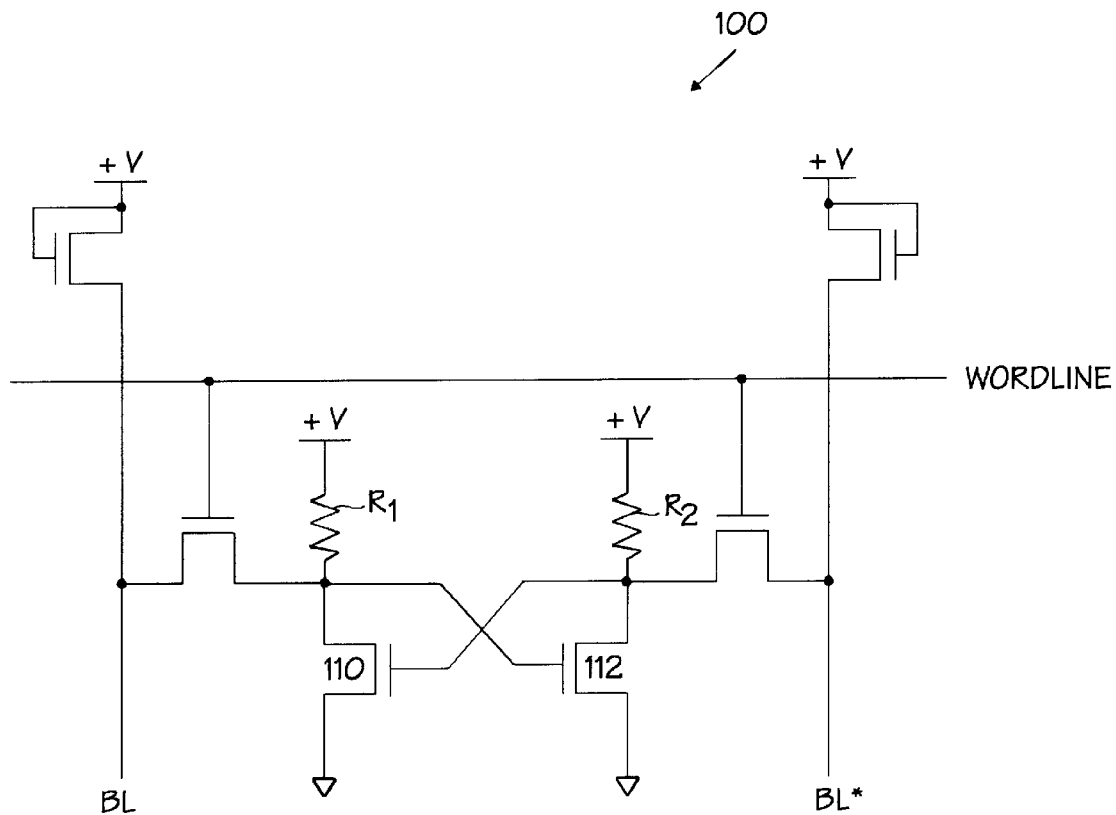
FIG. 1 is a conventional four-transistor/two-resistor static random access memory (SRAM) cell.
Figure 2:
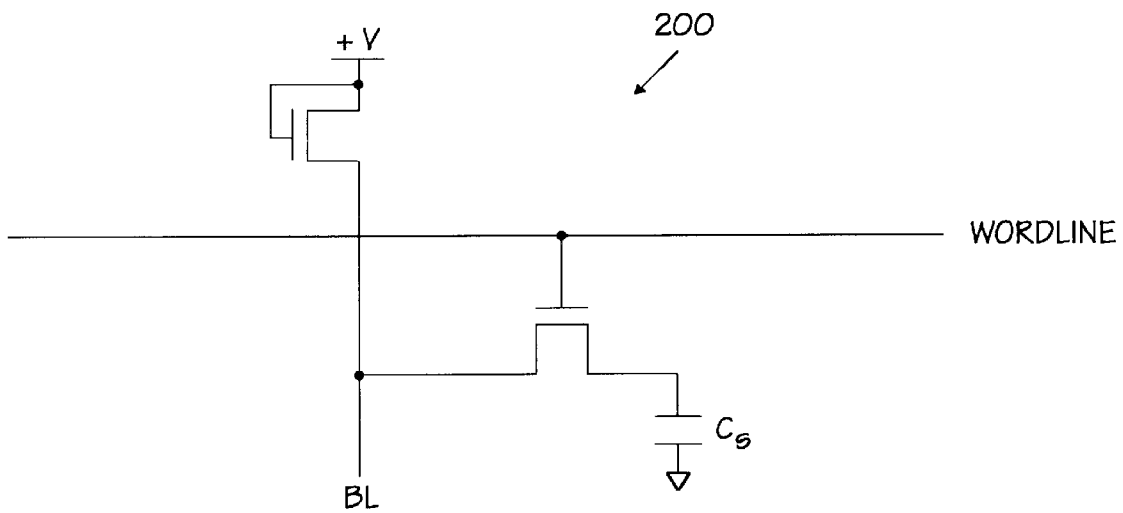
FIG. 2 is a conventional one-transistor dynamic random access memory (DRAM) cell.
Figure 3:
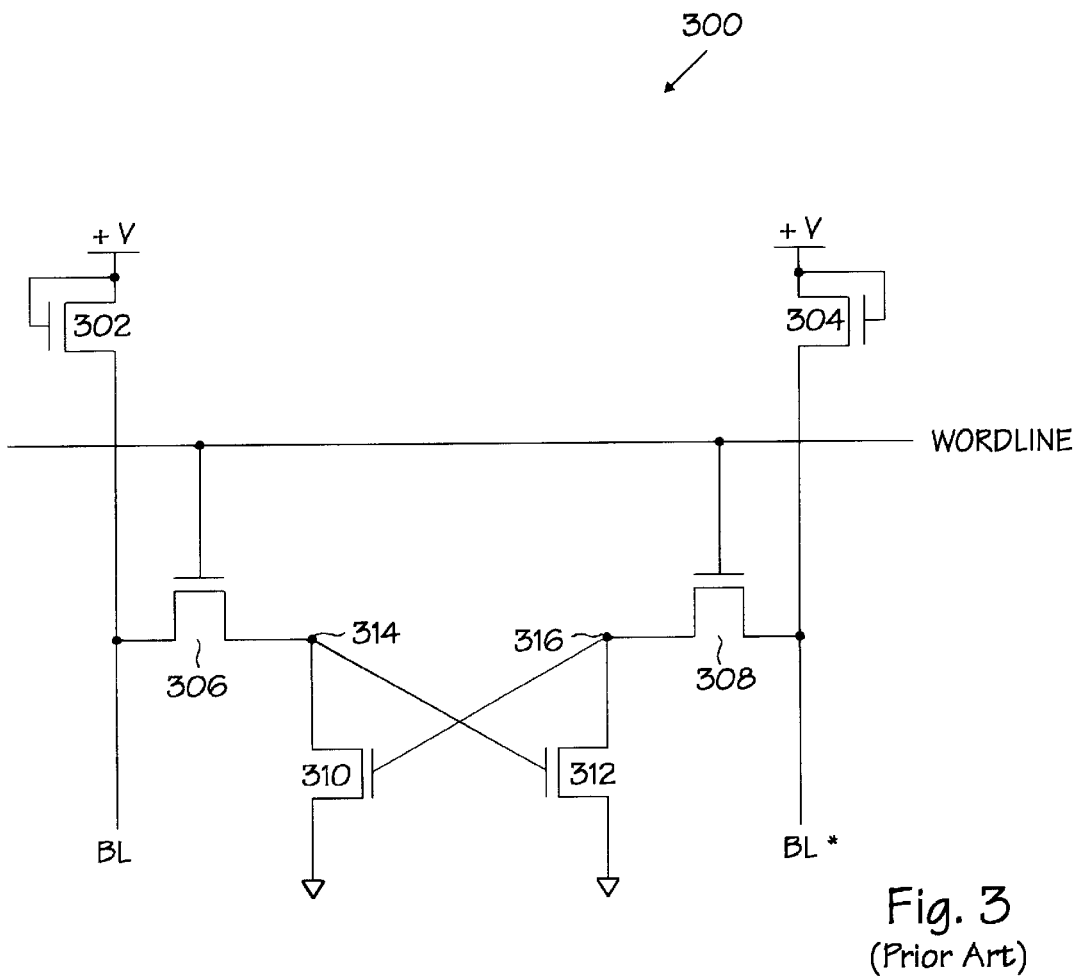
FIG. 3 is a conventional circuit diagram of a four-transistor DRAM cell.
Figure 4:
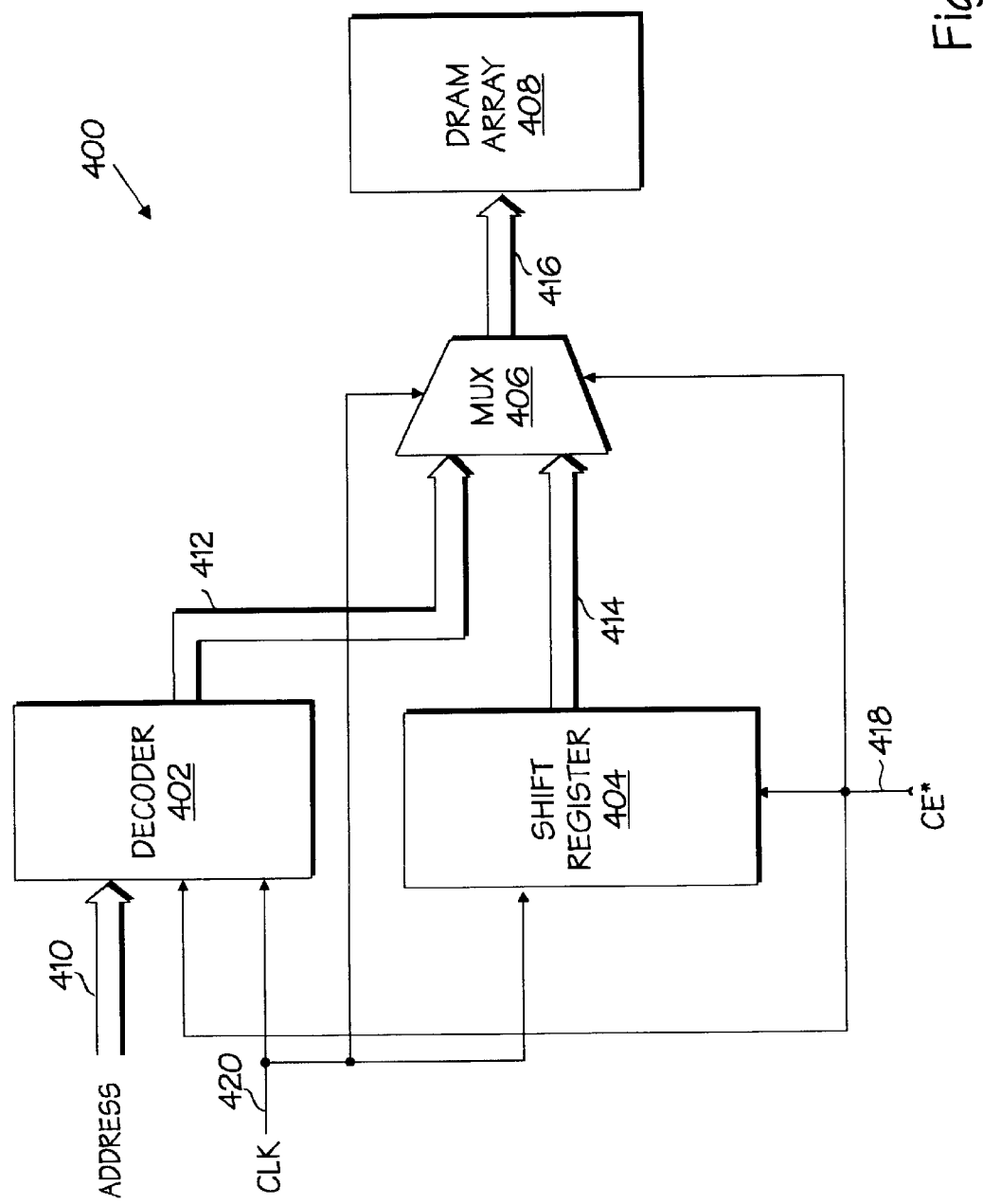
FIG. 4 a block diagram of one embodiment of the present circuit including a decoder, a shift register, a multiplexer, and a DRAM array.

FIG. 4 is a block diagram of a hidden refresh system 400 according to one embodiment of the present invention. System 400 includes DRAM array 408 (which preferably includes four-transistor or "4T" DRAM cells), multiplexer or selection circuit 406, decoder 402, and shift register 404. DRAM array 408 preferably includes 4T DRAM cells (as illustrated in FIG. 3), arranged in rows and columns. Each row of DRAM cells has a row address. A row address corresponds to a wordline which may be coupled to all the DRAM cells in a particular row. Thus, when a row address is selected by raising the corresponding wordline to a high voltage level, data may be stored in at least one of the DRAM cells or read from at least one of the DRAM cells coupled to the selected row address. The row address may be selected by an address provided to DRAM array 408 from multiplexer 406 via bus 416.

For one embodiment, system 400 is incorporated into a synchronous or asynchronous SRAM or cache memory device, and the address on bus 410 is an external address provided to the memory device.

The operational modes of system 400 include a read/write or normal mode, and a refresh mode. System 400 operates in the read/write mode when data is written to and read from DRAM array 408. System 400 operates in refresh mode when it refreshes the DRAM cells in DRAM array 408. As will be described below, the present refresh mode (a so-called "hidden refresh" mode) is transparent to a larger system incorporating system 400.

System 400 may operate synchronously or asynchronously. When system 400 is operating synchronously, clock signal CLK on line 420 may be coupled to decoder 402, shift register 404, and multiplexer 406. Clock signal CLK may optionally be coupled to DRAM array 408. For one embodiment, synchronous system 400 operates in either the read/write mode or the refresh mode in response to only the clock signal CLK on line 420 (irrespective of CE*). In this embodiment, system 400 operates in the read/write mode when clock signal CLK is in an active state, and operates in the refresh mode when the clock signal CLK in an inactive state.

In a synchronous read/write mode, clock signal CLK is active (e.g., logic one) and decoder 402 is enabled to decode the address on bus 410. For one embodiment, system 400 is incorporated into a synchronous RAM or cache memory device, and the address on bus 410 is an external address provided to the memory device. Decoder 402 provides the decoded address to multiplexer 406 via bus 412. With clock signal CLK active, multiplexer 406 is enabled to provide the decoded address on bus 412 to DRAM array 408 via bus 416.

When the decoded address from bus 412 is provided to bus 416 via multiplexer 406, data can then be read from or written to a DRAM cell in DRAM array 408, as is generally known in the art. Read and write control signals, column decoders, sense amplifiers, and other generally known circuitry associated with read and/or writing to a RAM cell are not shown in FIG. 4 so as to avoid obscuring the present invention.

In a synchronous refresh mode, clock signal CLK is inactive and shift register 404 may output a refresh address on bus 414. The inactive state of CLK enables multiplexer 406 to provide the refresh address to DRAM array 408 via bus 416. Shift register 404 may operate like a ring counter. Therefore, shift register 404 may output a plurality of signals on bus 414, wherein at any given time, only one of the signals is a logic one. Shift register 404 may be updated by each cycle of CLK on line 420 such that a new refresh address is provided to DRAM array 408 when CLK is inactive. Shift register 404 may be updated when CLK transitions from an active state to an inactive state. Alternatively, shift register 404 may be updated when CLK transitions from an inactive state to an active state.

The refresh address provided to DRAM array 408 selects a row address for refreshing. The entire selected row may be refreshed by selecting and/or reading the selected row.

For another embodiment, synchronous system 400 incorporates both the clock signal CLK and CE* (chip enable) on line 418. For one embodiment, system 400 may operate as described above regardless of the state of CE*. For an alternative embodiment, system 400 may respond to both CE* and CLK. In read/write mode, decoder 402 may decode the address on bus 410 when CLK is active and CE* is active (e.g., logic zero). For this alternative embodiment, multiplexer 406 may also couple the decoded address on bus 412 to bus 416 only when CE* is active and/or CLK is active. In refresh mode, shift register 404 may generate a refresh address on bus 414 when CLK is active (e.g., logic one) and CE* is inactive (e.g., logic one). Multiplexer 406 may also couple the refresh address on bus 414 to bus 416 only when CE* is inactive and/or CLK is active. For this alternative embodiment, DRAM cells in DRAM array 408 are refreshed when CE* is inactive and CLK is active. Thus, if CE* remains inactive for two clock cycles, two rows of DRAM cells in DRAM array 408 may be refreshed. For this alternative embodiment, CE* must transition between active and inactive states at a frequency sufficient to generate refresh addresses such that charge stored on any given DRAM cell in DRAM array 408 does not leak below a threshold value before being refreshed. For yet another embodiment, shift register 404 may generate a refresh address on bus 414 when CLK is inactive and CE* is inactive.

When system 400 operates synchronously, normal read and write operations occur preferably when CLK is active, and cells in DRAM array 408 may be refreshed when CLK is inactive. Therefore, refreshing cells of DRAM array 408 may be completely hidden from a system operating in conjunction with system 400. There is no system time lost to refreshing DRAM cells in DRAM array 408.

When hidden refresh system 400 operates as an asynchronous memory device, CLK 420 is not required and decoder 402, shift register 404, and multiplexer 406 may receive CE* on line 418. Asynchronous system 400 operates in either the read/write mode or the refresh mode in response to CE* on line 420. Asynchronous system 400 operates in read/write mode when CE* is in an active state (e.g., logic zero), and asynchronous system 400 operates in the refresh mode when CE* in an inactive state (e.g., logic one).

In an asynchronous read/write mode, decoder 402 is enabled to decode the address on bus 410 when CE* is active. Decoder 402 provides the decoded address to multiplexer 406 via bus 412. With CE* active, multiplexer 406 is enabled to provide the decoded address on bus 412 to DRAM array 408 via bus 416. Data may then be read from or written to a DRAM cell in DRAM array 408, as is generally known in the art.

In an asynchronous refresh mode, CE* in inactive and shift register 404 may output a refresh address on bus 414. The inactive state of CE* enables multiplexer 406 to provide the refresh address to DRAM array 408 via bus 416. Shift register 404 may be updated when CE* is inactive, or when CE* transitions from an active to an inactive state, such that a new refresh address is provided to DRAM array 408 when CE* is inactive. Alternatively, shift register 404 may be updated when CE* transitions from an inactive to an active state, such that a new refresh address is provided to DRAM array 408 when CE* is inactive.

The refresh address provided to DRAM array 408 selects a row address for refreshing. The entire selected row may be refreshed by selecting and/or reading the selected row. Refreshing cells of DRAM array 408 may be completely hidden from a system operating in conjunction with system 400 if CE* transitions at a frequency sufficient to refresh the DRAM cells in DRAM array 408 before the charge stored in any given cell leaks below a threshold value before refreshing. There is no system time lost to refreshing DRAM cells in DRAM array 408. For one embodiment, each row of DRAM cells in DRAM array 408 may be refreshed at least once every 4 milliseconds. Thus, for this embodiment, CE* must transition from an active state (i.e., system 400 enters the read/write mode) to an inactive state (i.e., system 400 enters the refresh mode) at a minimum frequency of 250X Hertz, where X is the number of rows in DRAM array 408.

Figure 5:
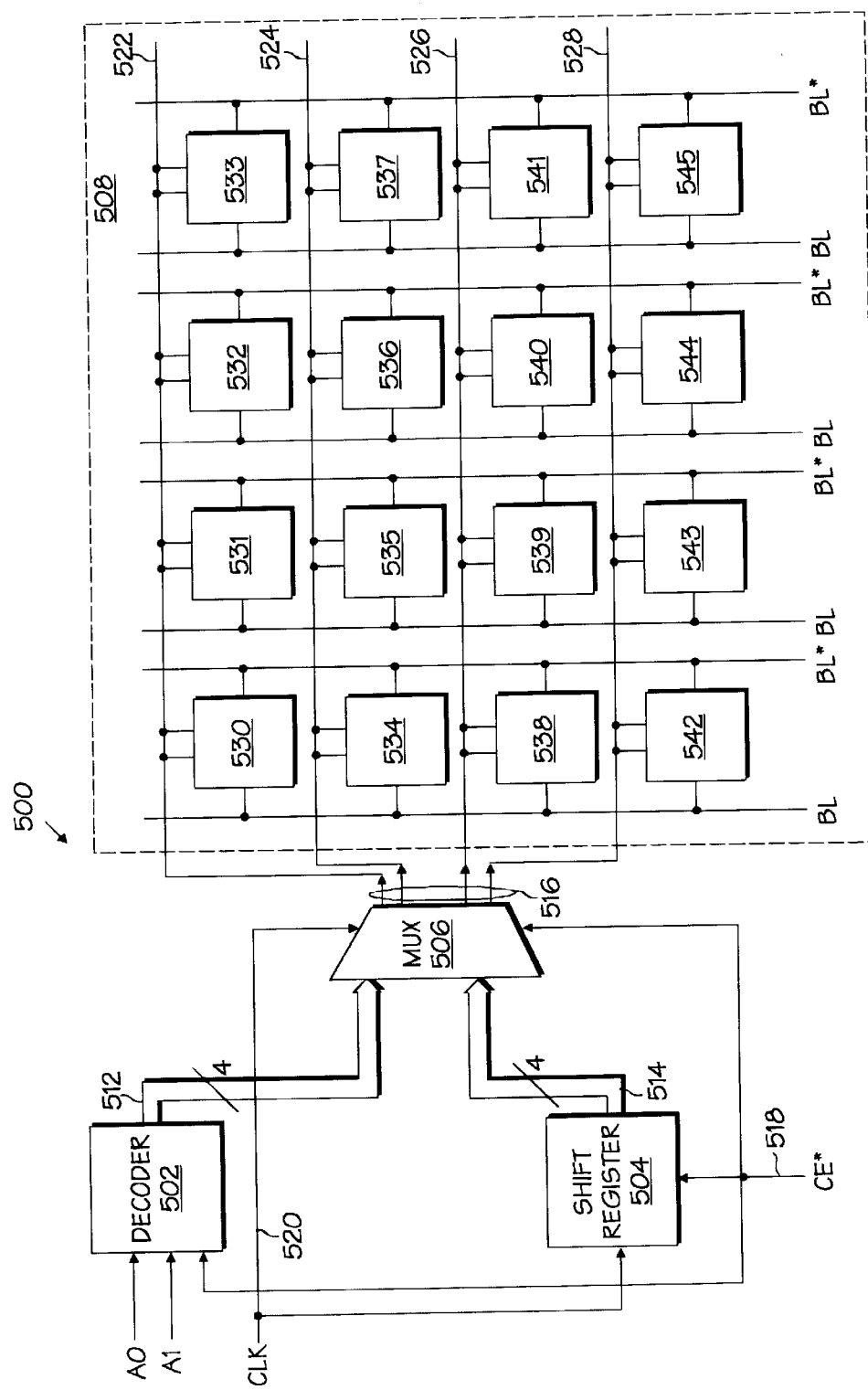
FIG. 5 shows a more detailed embodiment of the circuit of FIG. 4 including a 4×4, array of four-transistor DRAM cells.

FIG. 5 illustrates system 500 that represents a more detailed embodiment of system 400. System 500 includes DRAM array 508 having a 4×4 array of 4T DRAM cells 530–545. DRAM array 508 includes a first row of 4T DRAM cells 530–533 coupled to wordline 522, a second row of 4T DRAM cells 534–537 coupled to wordline 524, a third row of 4T DRAM cells 538–541 coupled to wordline 526, and a fourth row of 4T DRAM cells 542–545 coupled to wordline 528. Each of the 4T DRAM cells 530–545 is coupled to a bitline pair BL and BL*. Each of the 4T DRAM cells 530–545 may comprise a 4T DRAM cell as illustrated in FIG. 3.

In a synchronous read/write mode of operation, CLK on line 520 may be active and decoder 502 may decode the address provided on address lines A0 and A1. Address lines A0 and A1 enable system 500 to select one of four rows of addresses in DRAM array 508. The address decoded by decoder 502 is provided to bus 512 which may comprise, for example, four signal lines (one for every row in the array). Multiplexer 506 may be enabled by the active state of CLK on line 520 to couple the decoded address on bus 512 to bus 516. The decoded address may select or enable one of wordlines 522, 524, 526, or 528 such that data may be read from or written to one of 4T DRAM cells 530–545.

In a synchronous refresh mode of operation, when CLK on line 520 is inactive, shift register 504 may be enabled or configured to provide a refresh address onto bus 514 which may comprise, for example, four signal lines (one for every row in the array). Multiplexer 506 may be enabled by the inactive state of CLK on line 520 to couple the refresh address to bus 516. The refresh address may select or enable one of wordlines 522, 524, 526, or 528 such that the selected row of 4T DRAM cells may be refreshed. For example, if shift register 504 outputs an address of 1000, then multiplexer 506 couples this address to wordlines 522, 524, 526, and 528. Wordline 522 is selected and 4T DRAM cells 530–533 are refreshed. Selecting and/or reading 4T DRAM cells 530–533 refreshes the data stored in these cells. Wordline 522 may be selected by raising its voltage to a high logic level. DRAM cells 530–533 may be read by selecting wordline 522 and sensing the voltages and/or voltage difference of bitline pairs BL and BL*.

Each time CLK transitions from an active state to an inactive state, shift register 504 may generate a new refresh address on bus 514. For example, if the first refresh address is 1000, then on the next clock cycle, the second refresh address may be 0100. The second refresh address may select wordline 524 and refresh 4T DRAM cells 534–537. Alternatively, each time CLK transitions from an inactive state to an active state, shift register 504 may generate a new refresh address. The refresh address may be coupled to DRAM array 508 when CLK is inactive.

For another embodiment, synchronous system 500 may incorporate both the clock signal CLK and CE* on line 518. For one embodiment, system 500 may operate as described above regardless of the state of CE*. For an alternative embodiment, system 500 may respond to both CE* and CLK. In read/write mode, decoder 502 may decode an address on address lines A0 and A1 as long as CE* is active and CLK is active. Moreover, for this alternative embodiment, multiplexer 506 may couple the decoded address on bus 512 to select one of the wordlines 522, 524, 526, or 528 when both CLK and CE* are active (i.e., logic one and logic zero, respectively). In refresh mode, shift register 504 may be enabled or configured to provide a refresh address onto bus 514 when CE* is inactive, and when CLK transitions from an active state to an inactive state (or alternatively, when CLK transitions from an inactive state to an active state). Multiplexer 506 may be enabled by the inactive state of CLK on line 518 and the inactive state of CE*, to couple the refresh address to bus 516, and select or enable one of wordlines 522, 524, 526, or 528 for refreshing. Each time CLK transitions from an active state to an inactive state while CE* is inactive, shift register 504 may generate a new refresh address on bus 514. As previously discussed with respect to FIG. 4, CE* must transition at a frequency sufficient to refresh the DRAM cells in DRAM array 508 before the charge stored in any given cell leaks below a threshold value before being refreshed.

In an asynchronous read/write mode of operation, CE* on line 518 may be active and decoder 502 may decode the address provided on address lines A0 and A1. The decoded address is provided to bus 512. Multiplexer 506 may be enabled by the active state of CE* on line 518 to couple the decoded address on bus 512 to bus 516. The decoded address may select or enable one of wordlines 522, 524, 526, or 528 such that data may be read from or written to one of 4T DRAM cells 530–545.

In an asynchronous refresh mode of operation, CE* on line 518 may be inactive and shift register 504 may be enabled or configured to provide a refresh address onto bus 514. Multiplexer 506 is enabled by the inactive state of CE* on line 518 to couple the refresh address to bus 516. The refresh address may select or enable one of wordlines 522, 524, 526, or 528 such that the selected row of 4T DRAM cells may be refreshed.

Each time CE* transitions to an inactive state, shift register 504 may generate a new refresh address on bus 514. Multiplexer 506 may then couple the new refresh address to bus 516. As previously discussed with respect to FIG. 4, CE* must transition at a frequency sufficient to refresh the DRAM cells in DRAM array 508 before the charge stored in any given cell leads below a threshold value. Alternatively, each time CE* transitions to an active state, shift register 504 may generate a new refresh address. The refresh address may then be coupled to DRAM array 508 when CE* is inactive.

Systems 400 and 500 may be altered to support DRAM arrays having any number of DRAM cells and/or row and columns of DRAM cells.

Figure 6:
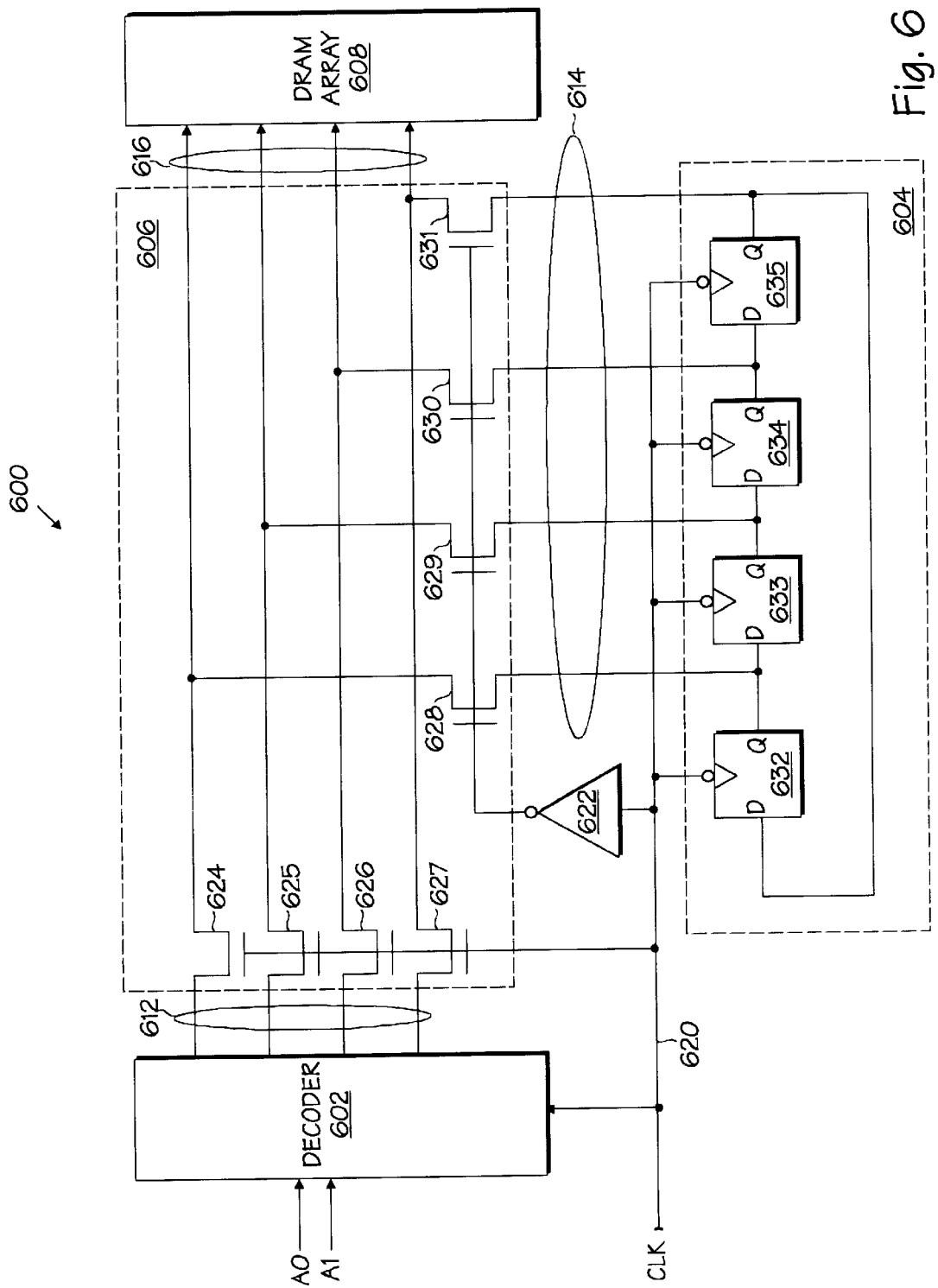
FIG. 6 is a circuit diagram of one embodiment of the shift register and multiplexer of FIG. 4.

FIG. 6 shows system 600, another embodiment of system 400 illustrated in FIG. 4. Hidden refresh system 600 is an exemplary synchronous system including decoder 602, DRAM array 608, shift register 604, multiplexer 606, and inverter 622.

DRAM array 608 may include a 4×4 matrix of 4T DRAM cells as illustrated in FIG. 5, or may include a matrix of any desired dimensions. Each row of DRAM array 608 is coupled to one of the signal lines of bus 616. Shift register 604 represents one embodiment of shift register 404 of FIG. 4, or shift register 504 of FIG. 5. For the 4×4 matrix of FIG. 6, shift register 604 may generate a refresh address having four signals. Multiplexer 606 represents one embodiment of multiplexer 406 of FIG. 4, or multiplexer 506 of FIG. 5. Multiplexer 606 may provide an address to DRAM array 608 from either bus 612 or bus 614 in response to, and/or depending on, the state of CLK on line 620.

In the synchronous read/write mode of operation, decoder 602 may decode the address provided on address lines A0 and A1 when CLK is active (logic one).

The decoded address may be provided onto bus 612 which comprises four signal lines in FIG. 6. When CLK is in the active state, a high logic level may be coupled to the gates of transistors 624–627 of multiplexer 606. Thus, transistors 624–627 are configured and/or enabled to couple the decoded address on bus 612 to DRAM array 608 (via bus 616). The decoded address may select or enable one row of DRAM cells in DRAM array 608 such that data may be read from or written to one of the DRAM cells in the selected row.

Transistors 624–627 are illustrated as n-channel MOS-FETs. Alternatively, any one or more of transistors 624–627 may comprise any other type of transistor or plurality of transistors, such as a CMOS transmission gate, a BICMOS transistor, a p-channel MOSFET, a bipolar transistor, or a conventional CMOS multiplexer circuit.

In the refresh mode of operation, CLK may be inactive (e.g., at a low logic level). When CLK is inactive, inverter 622 may couple a high logic level to the gates of transistors 628–631 of multiplexer 606. Thus, transistors 628–631 are configured and/or enabled to couple the refresh address on bus 614 to DRAM array 608 (via bus 616). When a row of DRAM cells is selected, the entire row may be refreshed by selecting and/or reading the row. As with transistors 624–627, any one or more of transistors 628–631 may alternatively comprise one of the various types of transistors mentioned above. If each of transistors 624–627 comprise a p-channel MOSFET, then inverter 622 may be omitted.

Shift register 604 may include four D-type registers 632–635. Each Q output is connected to the D input of the next D-type register, and the Q output of D-type register 635 is coupled to the D input of D-type register 632. Shift register 604 may be configured to output an initial or preferred state on bus 614, for example, on initialization or power-up, preferably such that only one of the Q outputs of D-type registers 632–635 generates a logic one. CLK may be coupled to the clock input of each of D-type registers 632–635 such that each transition from the active state to the inactive state causes the logic one state to be shifted to the Q output of the next D-type register. Alternatively, shift register 604 may be altered such that each transition of CLK from the inactive state to the active state causes the logic one state to be shifted to the Q output of the next D-type register, but the refresh address is only coupled to DRAM array 608 when CLK is in the inactive state.

When system 600 operates in the read/write or normal mode, CLK is preferably active and the decoded address on bus 612 may be coupled to DRAM array 608 via transistors 624–627. When hidden refresh system 600 operates in the refresh mode, CLK is preferably inactive (or transitions from the active state to the inactive state), shift register 604 outputs a different refresh address on bus 614 for each cycle of CLK, and each new refresh address is coupled to DRAM array 608 via transistors 628–631. Therefore, the refresh of DRAM cells in DRAM array 608 may be hidden without interrupting the normal system operation of system 600.

System 600 may be altered to function asynchronously by incorporating CE* into the circuit. As long as CE* transitions at a minimum frequency sufficient to keep the DRAM cells in DRAM array 608 refreshed, then interrupting normal system operations of DRAM array 608 may be avoided, and the refresh operation may be hidden from the normal system operation of system 600. CE* may be coupled to any one of decoder 602, multiplexer 606, and shift register 604. For example, decoder 602 may decode the address provided on address lines A0 and A1 when CLK is active and CE* on line 618 is also active (logic zero). For another example, CE* and CLK may be coupled to a logic gate (e.g., an AND gate or an OR gate) configured to generate a clock signal for shift register 604 only when CLK is a logic zero and CE* is a logic one. For yet another example, transistors 624–627 may be enabled or configured to couple the decoded address on bus 612 to bus 616 when CLK is a logic one and CE* is a logic zero.

System 600 may be altered to support a DRAM array having any number of DRAM cells and any desired number of rows. Preferred DRAM array configurations include $2^n$ rows by $2^m$ cells per row, where $2^{m+n}$ is the total size of the memory array. For an asymmetric memory arrangement, the number of rows may be any number n greater than or equal to one, and the number of cells per row may be any number m greater than or equal to one. For example, n may be greater than or equal to 3 and m greater than or equal to 1; preferably n may be greater than or equal to 5, and m greater than or equal to 4; and more preferably n may be greater than or equal to 8, and m greater than or equal to 8.

Figure 7:
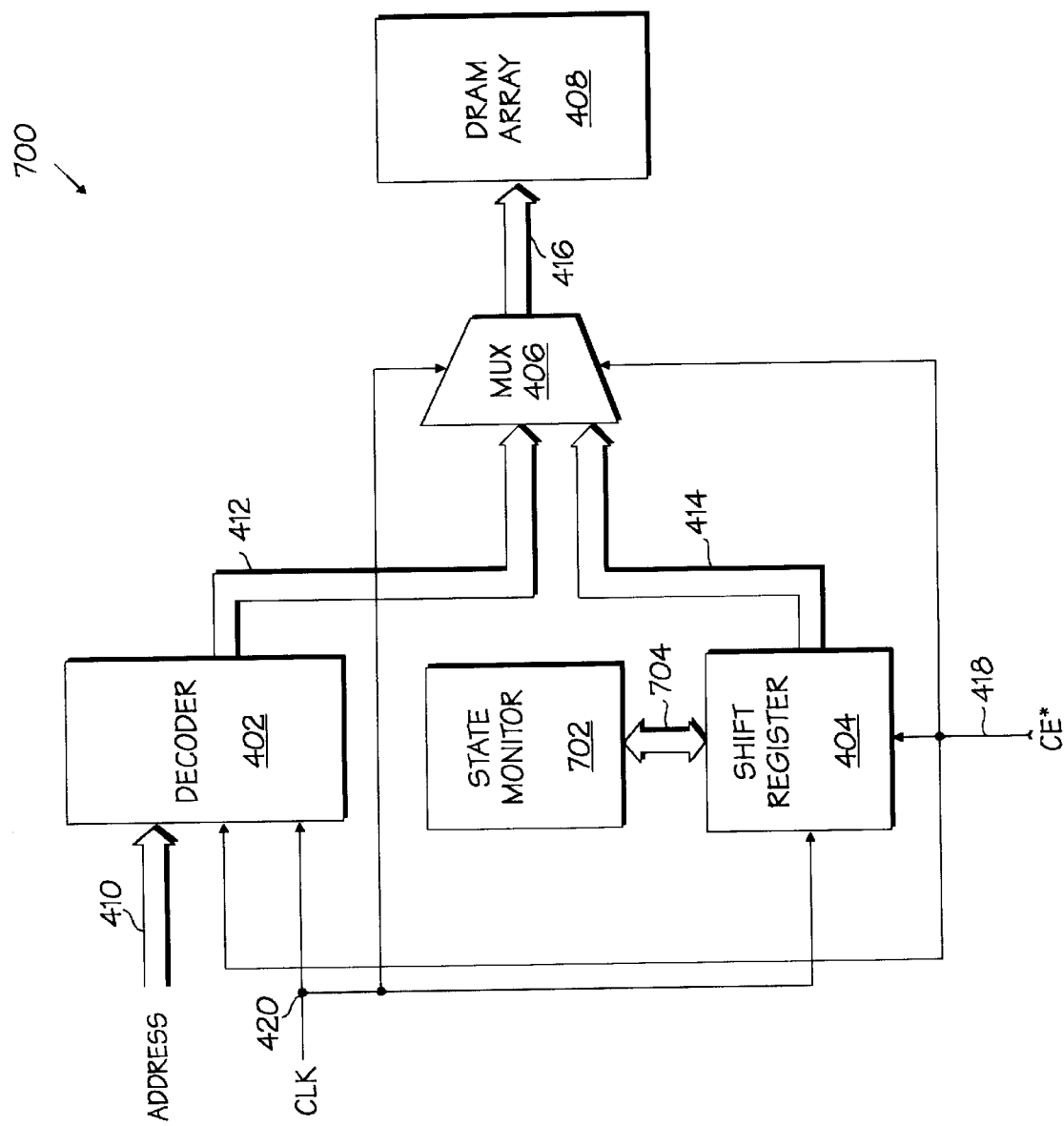
FIG. 7 is a block diagram of the circuit of FIG. 4 further including a state monitor.

FIG. 7 is block diagram of hidden refresh system 700, which is a further embodiment of system 400, further including state monitor 702. System 700 may operate asynchronously or synchronously. State monitor 702 optionally receives clock signal CLK on line 420 which may be coupled to shift register 404 via bus 704. State monitor 702 may monitor the output of shift register 404 to ensure that shift register 404 always outputs a valid refresh address. Due to radiation (e.g., alpha particles), electrical noise, or other phenomena, shift register 404 may output an invalid address, that is, an address not capable of refreshing a single row of cells (e.g., an address having all logic zeros, or an address containing more than one logic one). An exemplary valid refresh address is one in which one and only one signal line on bus 414 has a logic one level.

Preferably, only one row of DRAM cells is selected and refreshed in DRAM array 408 at one time. Selecting multiple rows for refreshing may cause contention on bitlines coupled to the selected DRAM cells when DRAM cells in the same column store different data. State monitor 702 provides a means for verifying that no invalid refresh addresses have been generated. State monitor 702 may also correct and/or reset the refresh address if an invalid address is detected.

When state monitor 702 detects an invalid refresh address generated by shift register 404, state monitor 702 may reset shift register 404 to its initial or preferred state. For one embodiment, state monitor 702 may reset shift register 404 by sending a reset signal across bus 704 to shift register 404. For another embodiment, state monitor 404 may temporarily interrupt the power supplied to shift register 404, so that shift register 404 returns to its initial or preferred state.

For another embodiment, state monitor 702 may return shift register 404 to a predefined state when an invalid refresh address is detected. The predefined state may not be the initial or preferred state of shift register 404.

For one embodiment, state monitor 702 may comprise adder circuitry that adds up all of the signals on bus 414. If the signals do not total a logic one, then either more than one signal line has been set to a logic one level, or no logic signal has been set to a logic one level (i.e., all zeros). In either case, state monitor 702 may detect an invalid refresh address output by shift register 404.

Figure 12:
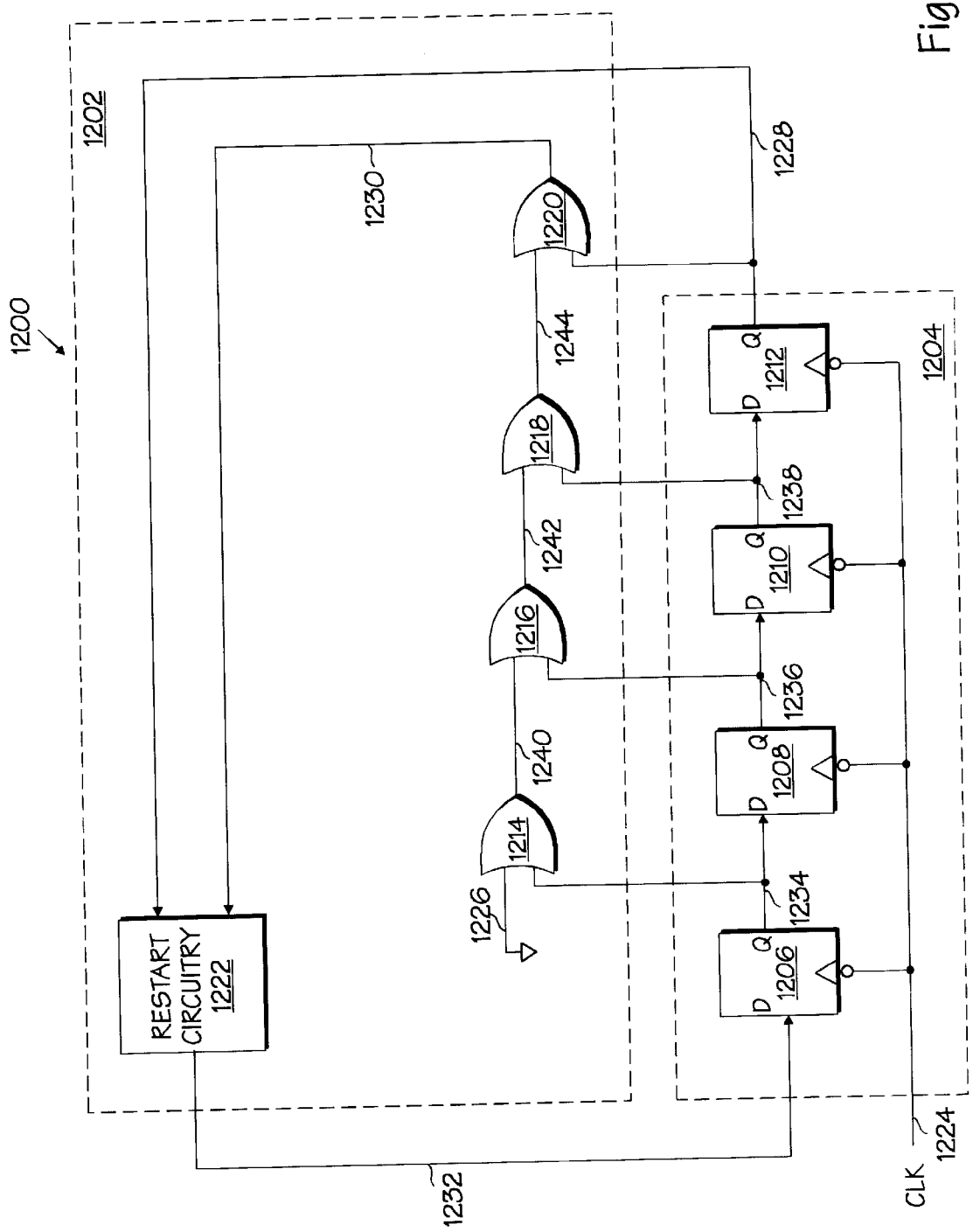
FIG. 12 is a one embodiment of the shift register and state monitor of FIG. 7.
Figure 13:
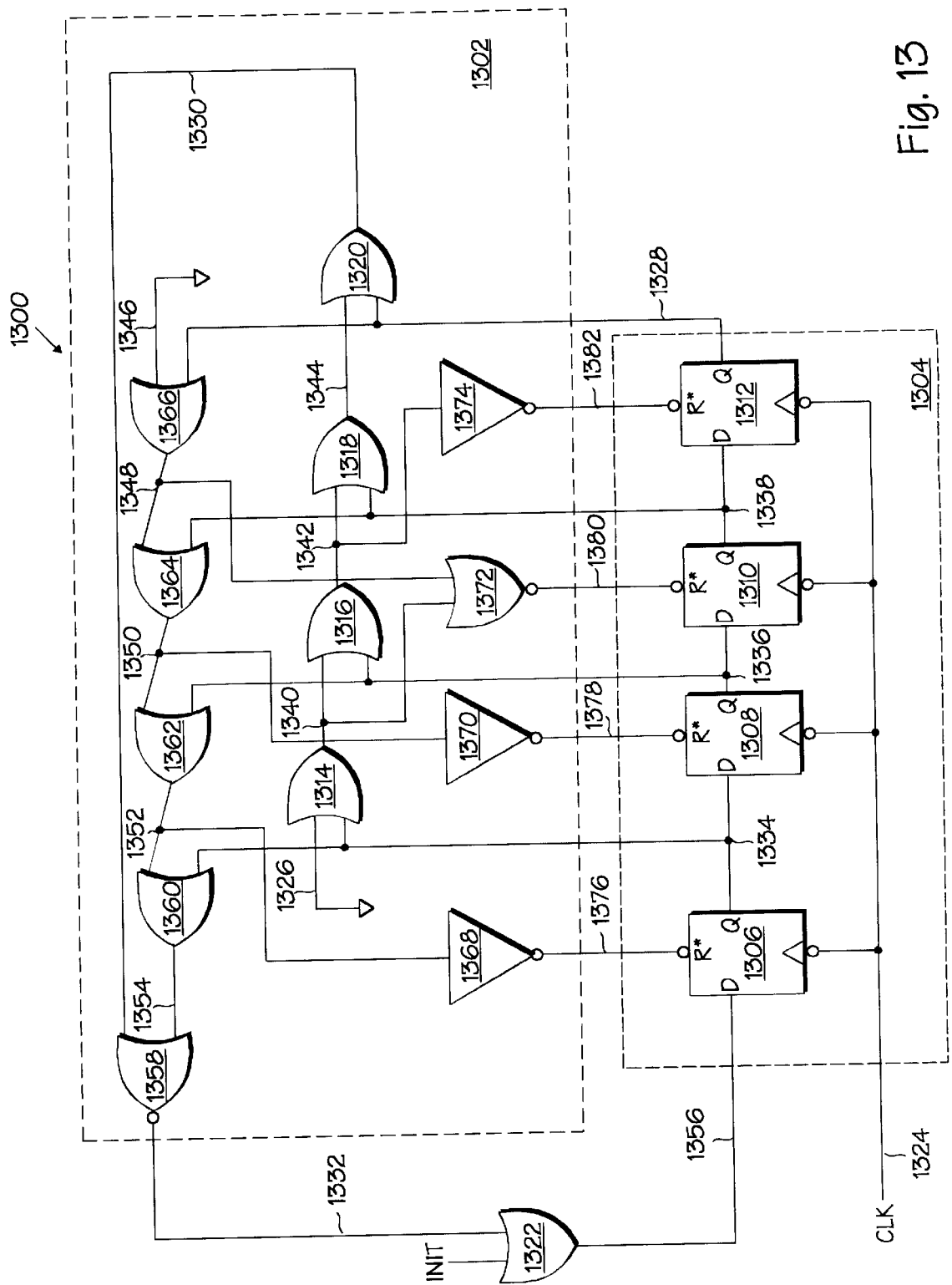
FIG. 13 is another embodiment of the shift register and state monitor of FIG. 7.

FIGS. 12–13 illustrate various other embodiments of state monitor 702. One skilled in the art will appreciate that many other embodiments of the state monitor 702 may be devised.

FIG. 12 illustrates hidden refresh system 1200 which represents one embodiment of shift register 404 and state monitor 702 of FIG. 7. System 1200 includes state monitor 1202 coupled to shift register 1204. System 1200 may be used in a hidden refresh system that includes four rows of DRAM cells in a DRAM array. The four rows of DRAM cells may be coupled to a refresh address output on the Q outputs of D-type registers 1206, 1208, 1210, and 1212.

System 1200 may be extended to accommodate a DRAM array having any number of rows of DRAM cells.

Shift register 1204 includes four D-type registers 1206, 1208, 1210, and 1212. The Q output of register 1206 is coupled to the D input of register 1208 via line 1234; the Q output of register 1208 is coupled to the D input of register 1210 via line 1236; the Q output of register 1210 is coupled to the D input of register 1212 via line 1238; and the Q output of register 1212 is coupled to restart circuitry 1222 via line 1228. Each of registers 1206, 1208, 1220, and 1212 also receives the clock signal CLK on line 1224.

State monitor 1202 includes restart circuitry 1222 and four two-input OR gates 1214, 1216, 1218, and 1220. OR gate 1214 has one input coupled to ground via line 1226, and the other input coupled to the Q output of register 1206; OR gate 1216 has one input coupled to the output of OR gate 1214 via line 1240, and the other input coupled to the Q output of register 1208; OR gate 1218 has one input coupled to the output of OR gate 1216 via line 1242, and the other input coupled to the Q output of register 1210; and OR gate 1220 has one input coupled to the output of OR gate 1218 via line 1244, and the other input coupled to the Q output of register 1212. The output of OR gate 1220 is coupled to restart circuitry 1222 via line 1230. Restart circuitry 1222 couples a signal to the D input of register 1206 via line 1232. The logic state of the signal on line 1232 depends upon the signals on lines 1228 and 1230.

State monitor 1202 may determine if shift register 1204 generates a refresh address on lines 1234, 1236, 1238, and 1228 having all logic zeroes. As described above, a refresh address that is all logic zeroes may not select a row of DRAM cells for refreshing in a DRAM array. Therefore, state monitor 1202 may detect if shift register 1204 generates all logic zeroes, and then may cause shift register 1204 to generate a refresh address wherein one of the Q outputs of registers 1206, 1208, 1210, and 1212 is a logic one.

Restart circuitry 1222 monitors the states of the signals on lines 1228 and 1230. Restart circuitry may comprise a state machine or logic components that may perform the functions outlined below. Restart circuitry 1222 may be optionally coupled to CLK on line 1224.

If the signal on line 1230 is in a logic one state, then at least one of the Q outputs of registers 1206, 1208, 1210, or 1212 is a logic one, and restart circuitry 1222 passes the signal on line 1228 to line 1232.

Restart circuitry 1222 may detect that a refresh address is all logic zeroes by determining if the signal on line 1230 is a logic zero for a period of time greater than or equal to the total propagation delay of OR gates 1214, 1216, 1218, and 1220. Restart circuitry 1222 may then couple a signal having a logic one state to the D input of register 1206 via line 1232 for one clock cycle of CLK. Thus, a refresh address having only one logic one state may then be generated.

For another embodiment, shift register 1204 may incorporate a reset signal that resets the outputs of registers 1206, 1208, 1210, and 1212 to either all logic zeroes, or some other preferred state.

For yet another embodiment, state monitor 1202 may not include OR gates 1214, 1216, 1218, or 1220. For this embodiment, restart circuitry 1222 may be reset to a known state at power-up or upon system initialization. Restart circuitry 1222 may then couple a signal having a logic one state to the D input of register 1206 for one clock cycle to generate a valid refresh address having only one logic one signal. Restart circuitry 1222 may then commence counting the number of clock cycles of CLK. If restart circuitry 1222 detects a signal having a logic one state on line 1228 before the count becomes greater than the number of D-type registers (e.g., when the count reaches five for the embodiment of FIG. 12), then the counter may be reset and the logic one signal on line 1228 may be coupled to line 1232. If restart circuitry does not receive a signal having a logic one state on line 1228 before the count becomes greater than the number of D-type registers, then restart circuitry 1222 may then couple a signal having a logic one state to the D input of register 1206 for one clock cycle to generate a valid refresh address having only one logic one signal.

FIG. 13 illustrates hidden refresh system 1300 which represents another embodiment of shift register 404 and state monitor 702 of FIG. 7. System 1300 includes state monitor 1302 coupled to shift register 1304. System 1300 may be used in a hidden refresh system that includes four rows of DRAM cells in a DRAM array. The four rows of DRAM cells may be coupled to a refresh address output on the Q outputs of D-type registers 1306, 1308, 1310, and 1312. System 1300 may be extended to accommodate a DRAM array having any number of rows of DRAM cells.

Shift register 1304 includes four D-type registers 1306, 1308, 1310, and 1312. The Q output of register 1306 is coupled to the D input of register 1308 via line 1334; the Q output of register 1308 is coupled to the D input of register 1310 via line 1336; the Q output of register 1310 is coupled to the D input of register 1312 via line 1338; and the Q output of register 1312 is coupled to one input of OR gate 1366 of state monitor 1302 via line 1328. Each of registers 1306, 1308, 1310, and 1312 also receives the clock signal CLK on line 1324.

State monitor 1302 includes a first group of four two-input OR gates 1314, 1316, 1318, and 1320, a second group of two-input OR gates 1360, 1362, 1364, and 1366, a group of inverters 1368, 1370, and 1374, and two two-input NOR gates 1372 and 1358. OR gate 1314 has one input coupled to ground via line 1326, and the other input coupled to the Q output of register 1306; OR gate 1316 has one input coupled to the output of OR gate 1314 via line 1340, and the other input coupled to the Q output of register 1308; OR gate 1318 has one input coupled to the output of OR gate 1316 via line 1342, and the other input coupled to the Q output of register 1310; and OR gate 1320 has one input coupled to the output of OR gate 1318 via line 1344, and the other input coupled to the Q output of register 1312. The output of OR gate 1320 is coupled to one input of NOR gate 1358 via line 1330.

OR gate 1366 has one input coupled to ground via line 1346, and the other input coupled to the Q output of register 1312; OR gate 1364 has one input coupled to the output of OR gate 1366 via line 1348, and the other input coupled to the Q output of register 1310; OR gate 1362 has one input coupled to the output of OR gate 1364 via line 1350, and the other input coupled to the Q output of register 1308; and OR gate 1360 has one input coupled to the output of OR gate 1362 via line 1352, and the other input coupled to the Q output of register 1306. The output of OR gate 1360 is coupled to one input of NOR gate 1358 via line 1354. NOR gate 1358 generates a signal on line 1332 in response to the signals on lines 1354 and 1330.

Inverter 1368 has an input coupled to the output of OR gate 1362, and an output coupled to the inverted reset input R* of register 1306; inverter 1370 has an input coupled to the output of OR gate 1364, and an output coupled to the inverted reset input R* of register 1308; NOR gate 1372 has one input coupled to the output of OR gate 1366, another input coupled to the output of OR gate 1314, and an output coupled to the inverted reset input R* of register 1310; and inverter 1374 has an input coupled to the output of OR gate 1316, and an output coupled to the inverted reset input R* of register 1312.

After system power-up or initialization, the initialize signal "INIT" may be asserted to a logic one state for one clock cycle of CLK. OR gate 1322 may then couple the INIT signal to the D input of register 1306 via line 1356. Each subsequent clock cycle of CLK, may shift the logic one state to the next register in shift register 1304.

State monitor 1302 may determine if shift register 1304 generates a refresh address having all logic zeroes on lines 1334, 1336, 1338, and 1328. OR gate 1358 monitors the states of the signals on lines 1354 and 1330. If one of the Q outputs of register 1306, 1308, 1310, or 1310 outputs a logic one state, then the signals on lines 1354 and 1330 may settle to a logic one state, and NOR gate 1358 may couple a logic zero to line 1332. However, if all of the Q outputs of registers 1306, 1308, 1310, and 1312 output logic zeroes, then NOR gate 1358 may couple a logic one state to line 1332. OR gate 1322 may then couple the logic one state to the D input of register 1306. The logic one state may then be shifted through shift register 1304 in each subsequent clock cycle of CLK.

Radiation (e.g., alpha particles), electrical noise, or some other phenomenon may cause shift register 1302 to generate a refresh address having more than one logic one state. State monitor 1304 may detect a refresh address having more than one logic one state, and cause shift register 1302 to generate a refresh address having only one logic one state. As described above, a refresh address that includes more than one logic one signal may try to select and/or refresh more than one row of DRAM cells at one time. Attempting to refresh DRAM cells in more than one row of a DRAM array may cause contention problems and potentially corrupt the data stored in the array.

State monitor 1304 may reduce the probability that shift register 1302 generates a refresh address having more than one logic one state. The Q output of each of registers 1306, 308, 1310, and 1312 is coupled back to the reset input R* of each of the preceding registers via OR gates 1366–1360, inverters 1368–1370, and NOR gate 1372. Thus, when one register outputs a logic one state, it may reset the preceding registers. Furthermore, register 1306 may be configured to reset register 1310 via OR gate 1314 and NOR gate 1372. Register 1306 may also be configured to reset register 1312 via OR gates 1314–1316 and inverter 1374. Similarly, register 1308 may be configured to reset register 1312.

For one example, consider the case where shift register 1304 generates a refresh address of 0110 from registers 1306, 1308, 1310, and 1312, respectively. The logic one output by register 1310 may be fed back through OR gate 1364 and inverter 1370 to reset register 1308. The Q output of register 1310 may remain unchanged. Thus, state monitor 1304 may cause shift register 1302 to output a refresh address of 0010 from registers 1306, 1308, 1310, and 1312, respectively.

For another example, consider the case where shift register 1304 generates a refresh address of 1110 from registers 1306, 1308, 1310, and 1312, respectively. The logic one output by register 1310 may be fed back through OR gate 1364 and inverter 1370 to reset register 1308. The logic one output by register 1308 (and the logic one output by register 1310) may be fed back by OR gate 1362 and inverter 1368 to reset register 1306. Prior to resetting register 1306, the logic one output by register 1306 may be fed forward by OR gate 1314 and NOR gate 1372 to reset register 1310. Thus, state monitor 1302 may force shift register 1304 to output refresh address 0000. State monitor 1302 may detect 0000 as an in invalid refresh address and then operate as previously described to cause shift register 1302 to output a refresh address of 1000 from registers 1306, 1308, 1310, and 1312, respectively.

For another embodiment, registers 1306, 1308, 1310, and 1312 may be reset at power-up, and OR gate 1322 and INIT may be omitted. For this embodiment, line 1332 may be coupled directly to line 1356.

Figure 8:
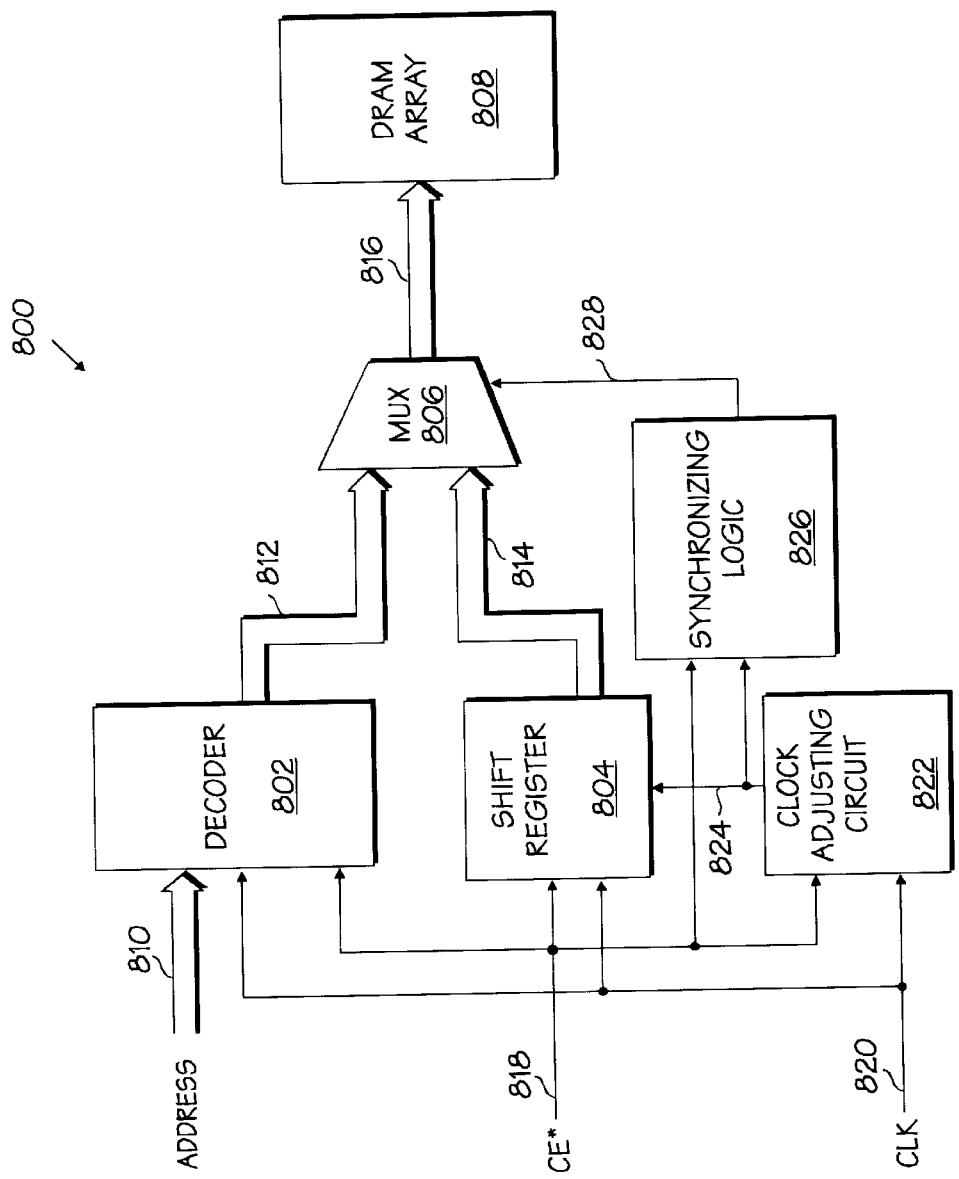
FIG. 8 is a block diagram of a further embodiment of the present circuit including a decoder, a shift register, a clock adjusting circuit, a multiplexer, and a DRAM array.

FIG. 8 illustrates a block diagram of a further hidden refresh system 800. System 800 includes decoder 802, shift register 804, multiplexer 806, and DRAM array 808 which are interconnected and operate in a manner similar to like numbered elements in FIG. 4. System 800 also includes clock adjusting circuit 822 and synchronizing logic 826. Clock adjusting circuit 822 enables system 800 to refresh DRAM array 808 at a frequency different than (preferably greater than) or equal to the frequency of the clock signal CLK on line 820.

The embodiments illustrated in FIGS. 4–7 are all configured to refresh at least one row of DRAM cells in the DRAM array each time CLK transitions from an active state to an inactive state. In system 800, clock adjusting circuit 822 generates an internal clock signal on line 824 operating at a frequency different than the frequency of CLK on line 820. When operating at a higher frequency, the internal clock may then clock shift register 804 multiple times in order to update the refresh address output on bus 814, thus refreshing multiple rows in one clock cycle. The internal clock signal on line 824 may be coupled directly to multiplexer 806. Thus, when system 800 operates synchronously, multiplexer 806 may couple a decoded address on bus 812 to bus 816 when the internal clock signal on line 824 is active and system 800 is operating in read/write mode, or multiplexer 806 may couple a refresh address on bus 814 to bus 816 when the internal clock signal on line 824 is inactive and system 800 is operating in refresh mode.

For one embodiment, the internal clock on line 824 and CE* on line 820 may be provided to synchronizing logic 826 which outputs a select signal on line 828 to multiplexer 806. Synchronizing logic 826 ensures that multiplexer 806 couples the decoded read/write address on bus 812 to bus 816 when hidden refresh system 800 operates in the read/write mode, and that multiplexer 806 couples the refresh address on bus 814 to DRAM array 808 when system 800 operates in refresh mode. Read/write mode and refresh mode may depend upon the state of CE*.

For one embodiment, synchronizing logic 824 comprises a two-input AND gate having one input coupled to CE*, and the other input coupled to the internal clock on line 824. For another embodiment, clock adjusting circuit 822 may increase the clock frequency of the internal clock on line 824 relative to CLK on line 820. In this embodiment, multiple rows of DRAM cells in DRAM array 808 may be refreshed per clock cycle of CLK on line 820.

Figure 9:
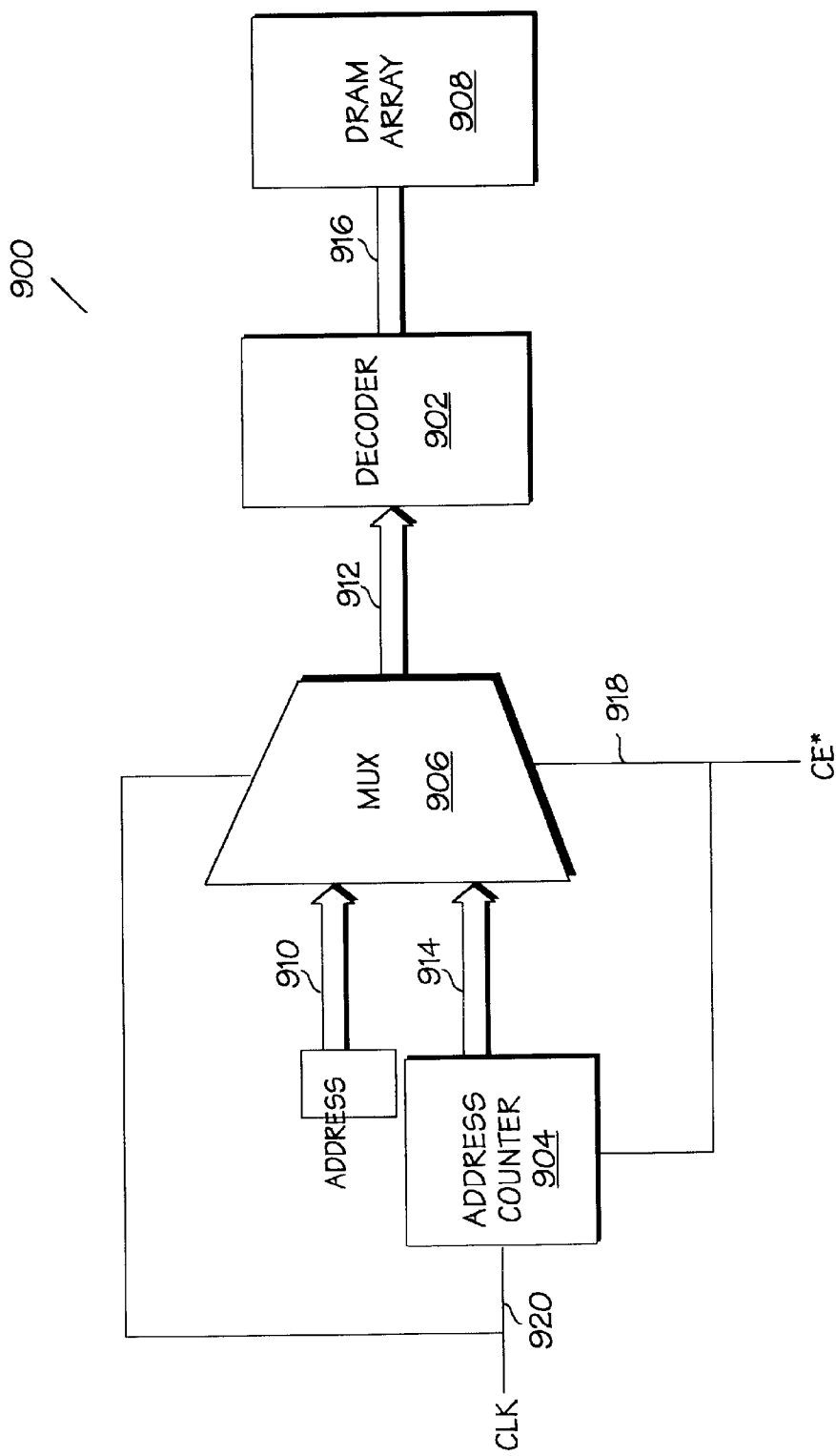
FIG. 9 is a block diagram of an even further embodiment of the present circuit including an address counter, a multiplexer, a decoder, and a DRAM array.

FIG. 9 is a block diagram of hidden refresh system 900. System 900 includes DRAM array 908, decoder 902, multiplexer 906 and address counter 904.

The operational modes of system 900 include a read/write or normal mode, and a refresh mode. System 900 operates in the read/write mode when data is written to and read from DRAM array 908. System 900 operates in refresh mode when it refreshes the DRAM cells in DRAM array 908. As will be described below, the refresh mode is hidden or transparent to a larger system incorporating system 900.

System 900 may operate synchronously or asynchronously. When system 900 is operating synchronously, clock signal CLK on line 920 may be coupled to address counter 904, and multiplexer 906. CLK may optionally be coupled to decoder 902 and/or DRAM array 908. For one embodiment, synchronous system 900 operates in either the read/write mode or the refresh mode in response to only the clock signal CLK on line 920. In this embodiment, system 900 operates in the read/write mode when clock signal CLK is in an active state, and operates in the refresh mode when the clock signal CLK in an inactive state.

In the synchronous read/write mode, CLK may be in an active state, and multiplexer 906 may provide the read/write or normal address on bus 910 to bus 912. Decoder 902 may decode the address on bus 912 and may provide the decoded address to DRAM array 908 via bus 916. For one embodiment, decoder 902 may decode the address on bus 912 when CLK on line 920 is active. For another embodiment, decoder 902 may decode the address on bus 912 irrespective of the state of CLK on line 920.

The decoded read/write address may select a row of DRAM cells so that data can be read from and written to one of the DRAM cells in the selected row. DRAM array 908 preferably includes 4T DRAM cells as illustrated in FIG. 3.

In a synchronous refresh mode of operation, CLK may be inactive, address counter 904 may output a refresh address on bus 914, and multiplexer 906 may couple the refresh address to bus 912. Address counter 904 preferably generates and outputs a sequential refresh address each time CLK transitions from an active state to an inactive state. Alternatively, address counter 904 generates and outputs a sequential refresh address each time CLK transitions from an inactive state to an active state.

Decoder 902 may then decode the refresh address and may provide the decoded refresh address to DRAM array 908 via bus 916. For one embodiment, decoder 902 may decode the address on bus 912 when CLK is inactive. For another embodiment, decoder 902 may decode the address on bus 912 irrespective of the state of CLK. The decoded refresh address may select, access, or enable one row of DRAM cells in DRAM array 908 so that the entire row may be refreshed. Alternatively, the entire selected row may be refreshed by reading the selected row.

For another embodiment, address counter 904 may generate non-sequential refresh addresses, as long as each refresh address required to refresh each row in DRAM array 908 is generated before data stored in the DRAM cells of DRAM array 908 leaks below a threshold value before being refreshed.

In an alternative embodiment, system 900 may utilize both CE* on line 918 and CLK on line 920 to control both the read/write and refresh modes of operation. In the synchronous read/write mode, when CLK may be active (e.g., logic one) and CE* may be active (e.g., logic zero), multiplexer 906 may couple the address on bus 910 to decoder 902 via bus 912. For one embodiment, decoder 902 may then decode the address on bus 912 and may couple the decoded address to bus 916 and DRAM array 908 if CE* and CLK are active. For another embodiment, decoder 902 may then decode the address on bus 912 and may couple the decoded address to bus 916 and DRAM array 908 irrespective of the states of CE* and CLK.

When system 900 operates in a synchronous refresh mode utilizing both CE* and CLK, CLK may be inactive (e.g., logic zero) and CE* may be inactive (e.g., logic one). Multiplexer 906 may then couple the refresh address from address counter 904 on bus 914 to decoder 902 via bus 912. For one embodiment, decoder 902 may then decode the address on bus 912 and may couple the decoded address to bus 916 and DRAM array 908 if CE* and CLK are inactive. For another embodiment, decoder 902 may then decode the address on bus 912 and may couple the decoded address to bus 916 and DRAM array 908 irrespective of the states of CE* and CLK. As discussed previously with respect to FIGS. 4–8, for this alternative embodiment, CE* must transition between active and inactive states at a frequency sufficient to generate refresh addresses such that charge stored on any given DRAM cell in DRAM array 908 does not leak below a threshold value before being refreshed. For yet another embodiment, system 900 may refresh cells in DRAM array 908 when CLK is active and CE* is inactive.

When system 900 operates in an asynchronous read/write mode, the clock signal CLK on line 920 may be omitted. When CE* is active, multiplexer 906 may couple the address from bus 910 to decoder 902 via bus 912. Decoder 902 may then decode the address and couple a decoded address to DRAM array 908 via bus 916. For one embodiment, decoder 902 may decode the address on bus 912 and may couple the decoded address to bus 916 when CE* is active. For another embodiment, decoder 902 may decode the address on bus 912 and may couple the decoded address to bus 916 irrespective of the state of CE*.

When system 900 operates in an asynchronous refresh mode, address counter 904 may generate a refresh address each time CE* transitions from an active state to an inactive state. Alternatively, address counter 904 may generate a refresh address each time CE* transitions from an inactive state to an active state. When CE* is inactive, multiplexer 906 may couple the refresh address on bus 914 to decoder 902 via bus 912. Decoder 902 may then decode the refresh address and couple the refresh address to DRAM array 908 via bus 916. For one embodiment, decoder 902 may decode the address on bus 912 and may couple the decoded address to bus 916 when CE* is inactive. For another embodiment, decoder 902 may decode the address on bus 912 and may couple the decoded address to bus 916 irrespective of the state of CE*.

As discussed previously with respect to FIGS. 4–8, when system 900 operates in an asynchronous read/write or refresh mode, CE* must transition between active and inactive states at a frequency sufficient to generate refresh addresses such that charge stored on any given DRAM cell in DRAM array 908 does not leak below a threshold value before being refreshed.

Alternatively, as illustrated in FIG. 8, a clock adjusting circuit may be provided to generate an internal clock signal from CLK on line 920 such that address counter 904 provides a refresh address for each clock cycle of the internal clock signal. The internal clock frequency may be different than the frequency of CLK on line 920. The internal clock signal may have a frequency faster than the frequency of CLK so that more than one row of DRAM cells in DRAM array 908 may be refreshed for each clock cycle of CLK on line 920. When a clock adjusting circuit is provided, a synchronizing (or arbitrating or prioritizing) circuit may also be provided and coupled to CE* and the internal clock. The synchronizing circuit may provide a select signal for multiplexer 906 such that when hidden refresh system 900 operates in the read/write or normal mode of operation, the read/write address may be coupled to bus 912, and when hidden refresh system 900 operates in the refresh mode of operation, the refresh address on bus 914 may be coupled to bus 912.

For another embodiment, a state monitor circuit as illustrated in FIG. 7 may be coupled to address counter 904 and/or decoder 902 to ensure that address counter 904 and/or decoder 902 provides a refresh address that selects and refreshes only one row of DRAM cells in DRAM array 908. If decoder 902 is made up of multiple stages, then address counter 904 may supply the refresh address on bus 914 at any stage of decoder 902.

Figure 10:
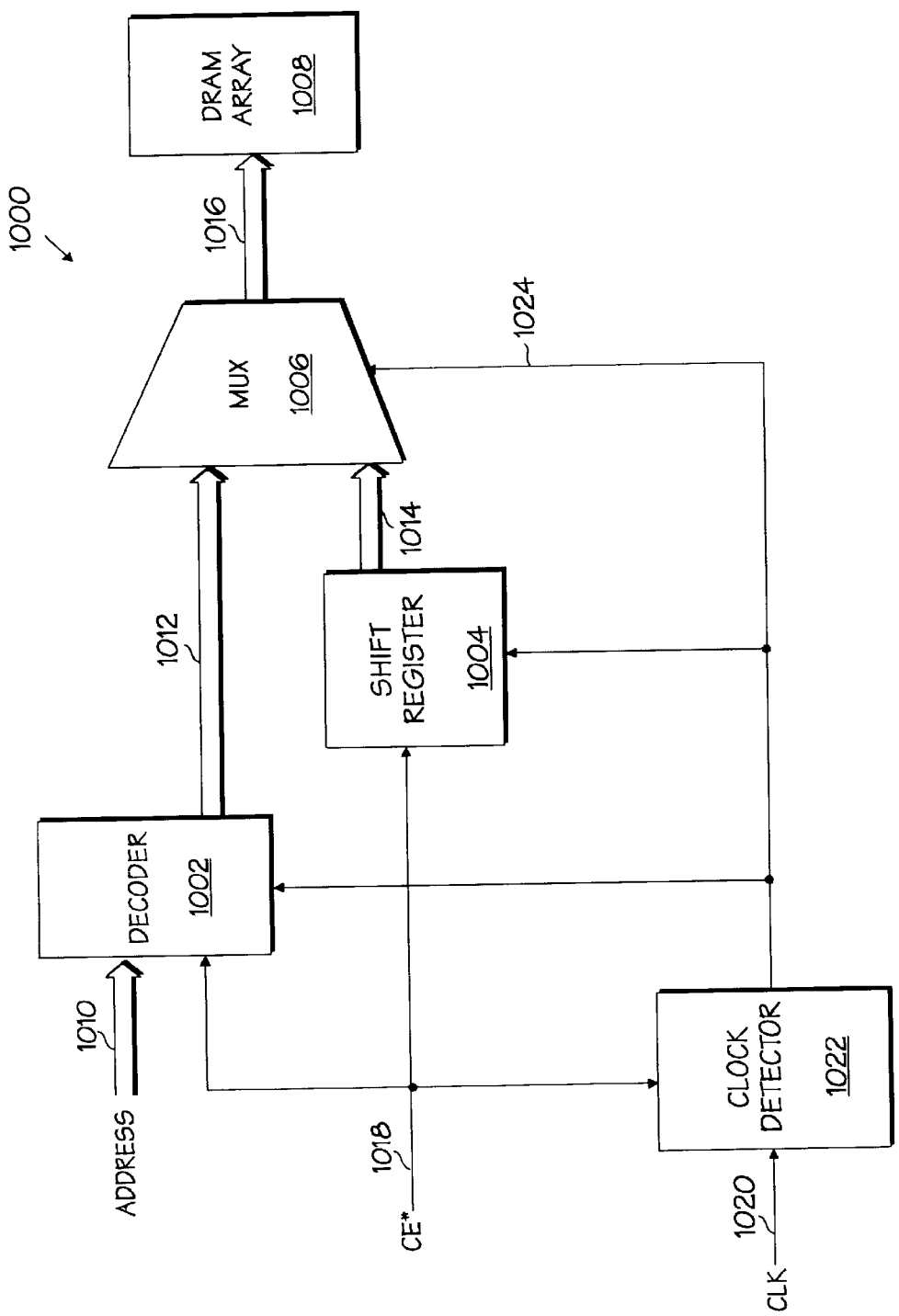
FIG. 10 is a block diagram of a further embodiment of the present circuit including a decoder, a clock detector, a shift register, a multiplexer, and a DRAM array.

FIG. 10 is a block diagram of a hidden refresh system 1000 including DRAM array 1008, multiplexer 1006, shift register 1004, and decoder 1002 that each function in a manner similar to like numbered elements in FIG. 4. System 1000 further includes clock detector 1022 receiving CLK on line 1020, CE* on line 1018, and outputting a signal on line 1024 that is coupled to decoder 1002, shift register 1004, and multiplexer 1006.

Clock detector 1022 may detect the frequency of CE* on line 1018 and/or the frequency of CLK on line 1020. If the frequency of CE* or CLK drops below a predetermined frequency, clock detector 1022 may generate its own internal clock signal on line 1024 so that multiplexer 1006 may couple a refresh address from shift register 1004 to DRAM array 1008 before the charge stored on a DRAM cell leaks below a threshold value before being refreshed.

For an alternative embodiment, CE* on line 1018 may be coupled directly to line 1024 to control multiplexer 1006, and clock detector 1022 may be used to provide an internal clock to shift register 1004 if CLK on line 1020 drops below a predetermined frequency.

For another embodiment, the signal generated on line 1024 may be synchronized with CE* on line 1018 so that the internal clock signal is only generated to update the refresh address and couple the refresh address to DRAM array 1008 when CE* is inactive.

Figure 11:
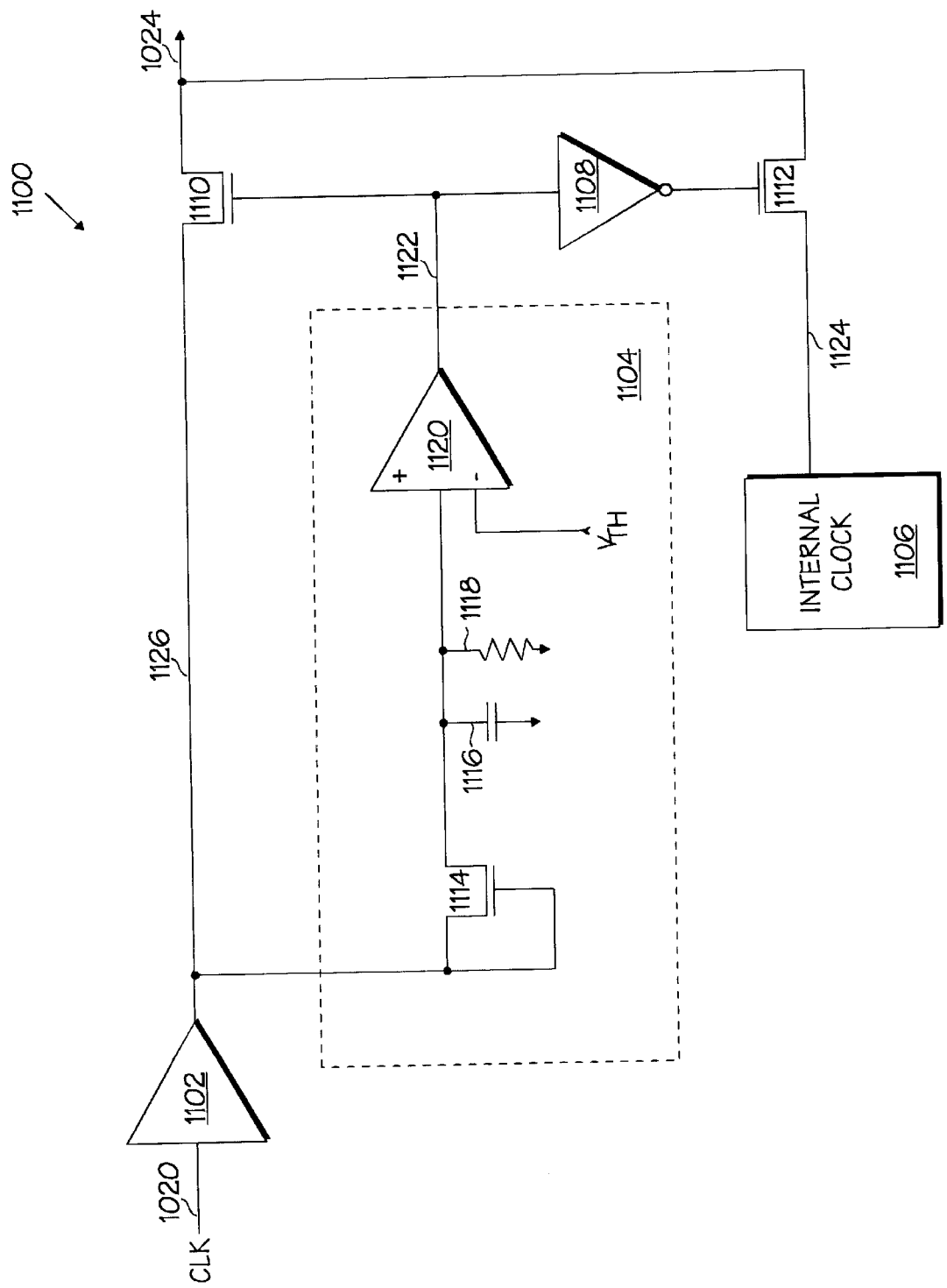
FIG. 11 is a circuit diagram of one embodiment of the clock detector of FIG. 10.

FIG. 11 illustrates a clock detector 1100 that represents a more detailed embodiment of clock detector 1022 of FIG. 10. Clock detector 1100 includes a detection circuit 1104 that may detect if CLK on line 1020 has remained in a low state for greater than a predetermined amount of time. If CLK has remained in a low state for greater than a predetermined amount of time, then internal clock 1106 may be enabled to provide a clock signal on line 1024.

CLK on line 1020 is optionally buffered by buffer 1102. Detection circuit 1104 may sense the buffered clock signal on line 1126. Capacitor 1116 may be charged through transistor 1114 while the buffered clock signal on line 1126 is in a high state. The charge stored on capacitor 1116 may generate a voltage on the non-inverted input of comparator 1120 so that comparator 1120 may output a high logic level to line 1122. The high logic level on line 1122 may enable or configure transistor 1110 to provide the buffered clock signal on line 1126 to line 1024. Additionally, the high logic level on line 1122 may cause inverter 1108 to output a low logic level to transistor 1112 such that transistor 1112 may be off (i.e., not conducting current).

When the buffered clock signal transitions to a low state, transistor 1114 may be shut off, and capacitors 1116 may discharge through resistor 1118. If the buffered clock signal remains in a low state for a sufficient length of time, the voltage on the non-inverted input of comparator 1120 may drop below a threshold voltage $V_{TH}$ (coupled to the inverted input of comparator 1120) and may cause the output of comparator 1120 to transition from a high logic level to a low logic level. The low logic level on line 1122 may cause transistor 1110 to shut off and transistor 1112 to turn on. When transistor 1112 is on, internal clock 1106 may be provided to line 1024.

For another embodiment, CE* may replace CLK as the input to buffer 1102 and clock detector 1100.

The embodiments illustrated in FIGS. 4–13 enable more memory cells to be placed in a memory device as compared with standard six-transistor and/or four-transistor/two-resistor SRAM cells. Given that the refresh of the DRAM arrays are completely hidden, a memory device incorporating the embodiments illustrated in FIGS. 4–13 may externally function like a normal SRAM device.

Although the present invention has been described in terms of specific embodiments, it will be appreciated that various modifications and alterations might be made by those skilled in the art without departing from the spirit and scope of the invention. The invention should therefore be measured in terms of the claims which follow.

What is claimed is:

1. A circuit comprising:
   a memory circuit having a first and second row of dynamic random access memory (DRAM) cells; and
   a multiplexer coupled to the memory circuit and receiving a select signal having a first state and a second state, wherein:
      the multiplexer couples a read/write address to the memory circuit when the select signal is in the first state, the read/write address selecting the first row of DRAM cells for writing or reading, and
      the multiplexer couples a refresh address to the memory circuit when the select signal is in the second state, the refresh address selecting the first or second row of DRAM cells for refreshing.

2. The circuit of claim 1, wherein the circuit further comprises:
   a decoder configured to (i) receive the read/write address and the refresh address from the multiplexer and (ii) provide a decoded address to the memory circuit; and
   a refresh address generator configured to generate the refresh address.

3. The circuit of claim 1, wherein the circuit further comprises:
   a decoder configured to provide the read/write address to the multiplexer in response to a row address; and
   a refresh address generator configured to generate the refresh address.

4. The circuit of claim 1, wherein one of the DRAM cells in the second row comprises a four-transistor DRAM cell.

5. The circuit of claim 4, wherein:
   each DRAM cell in the second row is coupled to a wordline; and
   the four-transistor DRAM cell in the second row comprises:
      a first pair of transistors coupled to the wordline; and
      a second pair of transistors coupled to the first pair of transistors and cross coupled with each other, wherein the second pair of transistors store data.

6. The circuit of claim 1, comprising:
   a refresh address circuit coupled to the multiplexer and configured to generate the refresh address.

7. The circuit of claim 6, wherein the refresh address circuit comprises a shift register circuit.

8. The circuit of claim 6, wherein the refresh address circuit comprises an address counter circuit.

9. The circuit of claim 6, further comprising:
   a state monitor circuit coupled to the refresh address circuit and configured to monitor the refresh address, wherein if the refresh address is invalid, then the state monitor circuit causes the refresh address circuit to output a valid refresh address.

10. The circuit of claim 1, wherein the select signal comprises a clock signal.

11. The circuit of claim 1, wherein the select signal comprises a chip enable signal.

12. The circuit of claim 1, wherein the select signal comprises a chip enable signal and a clock signal.

13. The circuit of claim 10, further comprising:
    a clock adjusting circuit coupled to the refresh address circuit and the selection circuit, wherein the clock signal has a first frequency and the clock adjusting circuit generates an internal clock signal having a second frequency different than the first frequency, wherein the refresh address circuit is configured to generate the refresh address in response to the internal clock.

14. The circuit of claim 6, further comprising:
    a detector circuit coupled to the multiplexer, wherein the detector circuit monitors a frequency of the select signal and couples an internal control signal to the refresh address circuit in place of the select signal if the frequency of the select signal falls below a predetermined frequency.

15. A method of operating a memory circuit having a first and second row of dynamic random access memory (DRAM) cells, comprising the steps of:
    providing a read/write address from a multiplexer to the memory circuit in response to a first state of a select signal, the read/write address selecting the first row of DRAM cells for writing or reading; and
    providing a refresh address from the multiplexer to the memory circuit in response to a second state of the select signal, the refresh address selecting the first or second row of DRAM cells for refreshing.

* * * * *